United States Patent
Omata et al.

(10) Patent No.: US 9,876,057 B2
(45) Date of Patent: Jan. 23, 2018

(54) ORGANIC ELECTROLUMINESCENCE PANEL, METHOD FOR MANUFACTURING THE SAME, ORGANIC ELECTROLUMINESCENCE MODULE, AND INFORMATION DEVICE

(71) Applicant: Konica Minolta, Inc., Tokyo (JP)

(72) Inventors: Kazuyoshi Omata, Akishima (JP); Natsuki Yamamoto, Kawasaki (JP)

(73) Assignee: KONICA MINOLTA, INC., Tokyo (JP)

( * ) Notice: Subject to any disclaimer, the term of this patent is extended or adjusted under 35 U.S.C. 154(b) by 12 days.

(21) Appl. No.: 15/121,580

(22) PCT Filed: Mar. 2, 2015

(86) PCT No.: PCT/JP2015/056035
§ 371 (c)(1),
(2) Date: Aug. 25, 2016

(87) PCT Pub. No.: WO2015/146495
PCT Pub. Date: Oct. 1, 2015

(65) Prior Publication Data
US 2016/0365391 A1 Dec. 15, 2016

(30) Foreign Application Priority Data
Mar. 28, 2014 (JP) ................. 2014-068398

(51) Int. Cl.
*H01L 27/32* (2006.01)
*H01L 51/52* (2006.01)
(Continued)

(52) U.S. Cl.
CPC ...... *H01L 27/3223* (2013.01); *H01L 27/3239* (2013.01); *H01L 27/3246* (2013.01);
(Continued)

(58) Field of Classification Search
CPC ............ H01L 27/3223; H01L 27/3239; H01L 27/3246; H01L 27/3276; H01L 51/5284;
(Continued)

(56) References Cited

FOREIGN PATENT DOCUMENTS

| JP | H04255692 A | 9/1992 |
|----|-------------|--------|
| JP | H08259938 A | 10/1996 |

(Continued)

OTHER PUBLICATIONS

International Search Report dated Apr. 21, 2015 for PCT/JP2015/056035 and English translation.
(Continued)

*Primary Examiner* — Douglas Menz
(74) *Attorney, Agent, or Firm* — Lucas & Mercanti, LLP

(57) ABSTRACT

An object of the present invention is to provide an organic EL panel having a display pattern that allows low power consumption, high emission uniformity, and high emission luminance ratio and makes it possible to reduce the manufacturing process time and provide high productivity, a method for manufacturing the organic EL panel, an organic EL module, and an information device. The organic EL panel of the present invention includes an organic EL device including an organic EL element having a pattern A including at least a light-emitting part and a non-light-emitting part; and at least one auxiliary member, wherein the organic EL element has an emission luminance ratio of the light-emitting part to the non-light-emitting part of 5:1 to 50:1, and the at least one auxiliary member has a pattern B being geometrically similar to the pattern A and including a light-transmitting part and a light-blocking part.

20 Claims, 9 Drawing Sheets

(51) Int. Cl.
*H01L 51/00* (2006.01)
*H01L 51/56* (2006.01)

(52) U.S. Cl.
CPC ...... *H01L 27/3276* (2013.01); *H01L 51/0004* (2013.01); *H01L 51/0018* (2013.01); *H01L 51/5284* (2013.01); *H01L 51/56* (2013.01); *H01L 51/5268* (2013.01); *H01L 2251/55* (2013.01)

(58) Field of Classification Search
CPC .. H01L 51/0004; H01L 51/0018; H01L 51/56
See application file for complete search history.

(56) References Cited

FOREIGN PATENT DOCUMENTS

| | | | |
|---|---|---|---|
| JP | 2003316302 A | 11/2003 |
| JP | 2005166365 A | 6/2005 |
| JP | 2005183045 A | 7/2005 |
| JP | 2011209346 A | 10/2011 |
| JP | 2012028335 A | 2/2012 |
| JP | 2012032497 A | 2/2012 |
| JP | 2012194291 A | 10/2012 |
| JP | 2013546154 A | 12/2013 |

OTHER PUBLICATIONS

Written Opinion dated Apr. 21, 2015 for PCT/JP2015/056035 and English translation.

$L_2 < L_1$ $L_2 < L_1$

ORGANIC ELECTROLUMINESCENCE PANEL, METHOD FOR MANUFACTURING THE SAME, ORGANIC ELECTROLUMINESCENCE MODULE, AND INFORMATION DEVICE

CROSS REFERENCE TO RELATED APPLICATION

This Application is a 371 of PCT/JP2015/056035 filed on Mar. 2, 2015 which, in turn, claimed the priority of Japanese Application No. 2014-068398 filed on Mar. 28, 2014, both applications are incorporated herein by reference.

TECHNICAL FIELD

The present invention relates to an organic electroluminescence panel designed to be used for icon display, a method for manufacturing the organic electroluminescence panel, an organic electroluminescence module, and an information device equipped therewith.

BACKGROUND ART

Conventional planar light sources include light guiding panel-equipped light emitting diodes (hereinafter abbreviated as LEDs) and organic light emitting diodes (hereinafter also referred to as organic electroluminescence elements, organic EL elements, or OLEDs).

Light guiding panel-equipped LED light sources have rapidly come into use as general lights and, for example, from around 2008, as major components for smart devices (such as smartphones and tablets), which gain widespread use. Principal applications are backlights of main displays (such as liquid crystal displays (LCDs)). Other applications include increasing cases where a light guiding panel-equipped LED light source is incorporated as a backlight for common function key buttons arranged at the lower part of a smart device or any other device or as a backlight for a logo on the backside.

In some cases, for example, three marks "home" (indicated by a square or other mark), "return" (indicated by an arrow mark or other mark), and "search" (indicated by a magnifier mark or other mark) are provided on common function key buttons, respectively.

In order to have improved visibility, such a common function key button includes a light guiding panel; a deflection pattern having dot shapes that are previously formed in the light guiding panel depending on the pattern of the mark to be displayed; and an LED light source for applying light to the side end face of the light guiding panel.

Specifically, a known method includes printing a pattern (for the mark to be displayed) on a surface cover glass and placing a light guide panel LED under the cover glass so that light can be emitted from the LED in response to necessary situations, then transmitted through the light guiding panel (film), and then extracted to the display side through a diffusion member having dot shapes printed at the patterned part.

For example, a structure is disclosed in which light emitted from an LED light source is incident on the side end face of a light guiding panel, and the incident light is totally reflected to the front face of the light guiding panel by the deflective reflection surface of the deflection pattern and then output in a certain pattern from the front face of the light guiding panel, so that the emitted light appears in the pattern when the light guiding panel is viewed from the front side (see, for example, Patent Literature 1).

Unfortunately, the problems described below will occur when a backlight based on an LED light guide system is to be installed in a smart device. A first problem is that a thinner light guiding panel (e.g., film base material) is necessary because the smart device has a narrow installation space and a significant limitation on the thickness or size of the backlight to be installed. However, a thinner light guiding panel as a display member can reduce the luminous efficiency of LED light sources.

A second problem is that since light is guided from the side of an icon display part including a plurality of common function key buttons, the emission luminance distribution can be uneven depending on the pattern or shape of each common function key button. As a countermeasure against the uneven emission luminance distribution, the number of arranged LED light sources should be increased. However, this method can lead to an increase in cost and power consumption.

In view of the above problems, techniques for forming planar emission patterns using organic EL elements have been increasingly studied as an alternative to the light guide systems using LEDs. Organic EL elements are thin film-type, completely solid elements capable of emitting light at a low voltage of several to several tens V and have many superior properties such as low power consumption, high luminance, high luminous efficiency, emission uniformity, slimness, and light weight. In recent years, therefore, organic EL elements have been attracting attention as surface light emitters for various display backlights, display boards such as signboards and emergency lights, and illumination light sources.

Such organic EL elements have a structure in which organic functional layers including a light-emitting layer made of an organic material are stacked between two electrodes. In such elements, light is emitted from the light-emitting layer, transmitted through the electrode, and extracted to the outside. Therefore, at least one of the two electrodes is a transparent electrode, and the emitted light is extracted from the transparent electrode side. Organic EL elements can also produce high luminance at low electric power and also have superior properties in terms of visibility, response speed, life, and power consumption.

Various methods can be used to define the light-emitting area on the substrate of organic EL elements. Examples of such methods include a method of defining the light-emitting area by the shape of electrodes sandwiching a group of organic functional layers; a method of defining the light-emitting area by the shape of an insulating material formed on the electrode; a method of defining the light-emitting area by the area at which a hole or electron injection layer is deposited; a method of defining the light-emitting area by the area at which a light-emitting layer is deposited; and a method of defining the light-emitting area by carefully forming the area at which an intermediate connector for connecting light-emitting units is deposited, in the case of what is called a tandem element having a plurality of light-emitting units.

Methods for defining the shape of the light-emitting area by each of these methods include a method of defining the area shape by the shape of a mask during vapor deposition; a method of defining the area shape by physically deleting the organic layer and the electrode after the deposition; a method of defining the area shape by chemically altering the organic layer and the electrode; a photolithographic method;

and a method of defining the area shape by damaging the organic layer by applying electron beams or electromagnetic waves to the organic layer.

In particular, there is known a method of patterning a light-emitting area by applying electron beams or electromagnetic waves such as ultraviolet rays to a group of organic functional layers to damage a light-emitting layer and other organic functional layers. This method attracts attention because when this method is performed using a mask, complicated shapes can be easily formed, which would otherwise be difficult to achieve by conventional techniques in view of manufacturing cost or complicated manufacturing process.

For example, there is disclosed a method of patterning a light-emitting area by applying electron beams or ultraviolet rays to a certain region so that the organic material constituting a group of organic functional layers is degraded (deactivated) in the region (see, for example, Patent Literature 2). There is also disclosed a similar method of patterning a light-emitting area by damaging the light-emitting layer of an organic EL element by applying ultraviolet rays (see, for example, Patent Literature 3).

There is also proposed an organic light-emitting element having a specific light-emitting pattern that is formed by applying ultraviolet light to at least one organic functional layer or constituent electrode layer through a photomask in the process of manufacturing an organic EL element so that the function of a predetermined pattern region is altered (see, for example, Patent Literature 4).

Unfortunately, the proposed methods have the problems described below, when used in the process of forming an icon or a logo pattern in an organic electroluminescence panel (hereinafter referred to as an organic EL panel) by applying electron beams or ultraviolet rays.

Specifically, a light-emitting part and a non-light-emitting part for a display pattern should be formed so as to achieve an emission luminance ratio of the former to the latter of about 200:1. In order to meet such conditions, the time of irradiation with ultraviolet rays or the like during the patterning should be long, which requires the ultraviolet irradiation system to have a high power and increases the size of the facility and the lead term during the manufacture, so that the economic burden increases.

Thus, there has been a demand for the development of a light-emitting panel that allows electric power to be supplied only to the light-emitting part with no need to guide light to unnecessary parts in a display method based on an LED light guide system, and also has low power consumption and improved display uniformity. There has also been a demand for a light emitting panel-forming method that has a short lead time for a patterning step using ultraviolet rays in the process of forming a display pattern in an organic EL panel, and also has low facility load and high cost-effectiveness.

CITATION LIST

Patent Literature

Patent Literature 1: JP 2012-194291 A
Patent Literature 2: JP 2005-183045 A
Patent Literature 3: JP 04-255692 A
Patent Literature 4: JP 2012-028335 A

SUMMARY OF INVENTION

Technical Problem

The present invention has been made in view of the above problems and circumstances, and an object thereof is to provide an organic electroluminescence panel having a display pattern (such as an iron or a logo pattern) that allows low power consumption, high emission uniformity, and high emission luminance ratio and makes it possible to reduce the manufacturing process time and to provide high productivity, a method for manufacturing the organic electroluminescence panel, an organic electroluminescence module, and an information device.

Solution to Problem

As a result of intensive studies to solve the above problems, the inventors have found that when an organic electroluminescence panel including: an organic electroluminescence device including an organic electroluminescence element having a pattern A including at least a light-emitting part and a non-light-emitting part; and an auxiliary member or members is so designed that the organic electroluminescence element has an emission luminance ratio of the light-emitting part to the non-light-emitting part within a certain low range and at least one of the auxiliary members has a pattern B being geometrically similar to the pattern A and having a light-transmitting part and a light-blocking part, the organic electroluminescence panel can have a display pattern (such as an iron or a logo pattern) that allows low power consumption, high emission uniformity, and high emission luminance ratio and makes it possible to reduce the manufacturing process time and to provide high productivity.

Specifically, the objects of the present invention are achieved by the following means.

1. An organic electroluminescence panel including: an organic electroluminescence device including an organic electroluminescence element having a pattern A including at least a light-emitting part and a non-light-emitting part; and at least one auxiliary member, wherein the organic electroluminescence element has a ratio of the emission luminance of the light-emitting part to the emission luminance of the non-light-emitting part of 5:1 to 50:1, and the at least one auxiliary member has a pattern B being geometrically similar to the pattern A and including a light-transmitting part and a light-blocking part.

2. The organic electroluminescence panel according to Item. 1, wherein a light extraction film and a top cover are stacked as the auxiliary members in this order on the organic electroluminescence device, wherein the light extraction film is an outcoupling film, and the pattern B is formed on the outcoupling film.

3. The organic electroluminescence panel according to Item. 1, wherein a light extraction film and a top cover are stacked as the auxiliary members in this order on the organic electroluminescence device, and the pattern B is formed on the top cover.

4. The organic electroluminescence panel according to Item. 1, wherein a top cover with the pattern B printed thereon is provided as the auxiliary member on the organic electroluminescence device.

5. The organic electroluminescence panel according to any one of Items. 1 to 4, wherein the light-emitting part of the pattern A of the organic electroluminescence element has an area larger than that of the light-transmitting part of the pattern B of the auxiliary member.

6. The organic electroluminescence panel according to any one of Items. 1 to 5, wherein a stack of the organic electroluminescence device and the auxiliary member forms a display part and a non-display part, and the ratio of the emission luminance of the display part to the emission luminance of the non-display part is higher than the ratio of the emission luminance of the light-emitting part to the emission luminance of the non-light-emitting part in the organic electroluminescence element of the organic electroluminescence device.

7. A method for manufacturing an organic electroluminescence panel including: an organic electroluminescence device including an organic electroluminescence element having a pattern A including a light-emitting part and a non-light-emitting part; and at least one auxiliary member, the method including: forming the light-emitting part and the non-light-emitting part by subjecting the organic electroluminescence element to patterning by photoirradiation in such a manner that the contrast ratio (luminance ratio) of the light-emitting part to the non-light-emitting part falls within the range of 5:1 to 50:1; and forming a pattern B in or on the at least one auxiliary member in such a manner that the pattern B has a shape geometrically similar to the pattern A and includes a light-transmitting part and a light-blocking part.

8. The method for manufacturing an organic electroluminescence panel according to Item. 7 for manufacturing an organic electroluminescence panel, wherein the pattern A of the organic electroluminescence element is formed by batch patterning through a mask using an ultraviolet radiation source.

9. The method for manufacturing an organic electroluminescence panel according to Item. 7 or 8 for manufacturing an organic electroluminescence panel, wherein the pattern B of the auxiliary member is formed by a printing method.

10. An organic electroluminescence module including: the organic electroluminescence panel according to any one of Items. 1 to 6; and an electrical connection unit placed on the panel.

11. An information device including a main display screen and a sub display screen, wherein the main display screen and the sub display screen are arranged on the same surface side, and the sub display screen is an icon display part and includes the organic electroluminescence module according to Item. 10.

12. An information device including a main display screen and a sub display screen, wherein the sub display screen is placed on a surface side opposite to the main display screen, and the sub display screen is an iron display part and includes the organic electroluminescence module according to Item. 10.

Advantageous Effects of Invention

The means according to the present invention described above makes it possible to provide an organic electroluminescence panel having a display pattern that allows low power consumption, high emission uniformity, and high emission luminance ratio and that makes it possible to reduce the manufacturing process time and to provide high productivity, a method for manufacturing the organic electroluminescence panel, an organic electroluminescence module, and an information device.

The technical features of the organic electroluminescence module (hereinafter also referred to as the organic EL module) according to the present invention and the mechanism of how advantageous effects are produced by the technical features will be described below.

A conventional method of forming a display pattern such as an icon or a logo pattern in an organic EL panel includes applying ultraviolet rays or the like only to an organic EL element as a component of the organic EL panel to form a display pattern. In such a method, the emission luminance ratio of the light-emitting part to the non-light-emitting part should be set to at least 200:1 in the process of forming them only in the organic EL element. In order to meet such conditions, the time of irradiation with ultraviolet rays or the like during the patterning should be long, which requires the ultraviolet irradiation system to have a high power and increases the size of the facility and the lead term during the manufacture, so that the economic burden increases.

There is another method of forming a display pattern by stacking certain patterns of a light-transmitting part and a light-blocking part without forming a display pattern in an organic EL element. Unfortunately, this method can increase unnecessary power consumption and have very low efficiency because this method makes the organic EL element produce whole surface emission in order to form a display pattern with a very small area.

The organic EL panel of the present invention, which is provided in view of the problems with the conventional techniques described above, has the following structural features: it includes an organic electroluminescence device (hereinafter referred to as an organic EL device) having a pattern A including at least a light-emitting part and a non-light-emitting part, and an auxiliary member or members; the light-emitting part and the non-light-emitting part of the organic EL element are so formed that the emission luminance ratio of the light-emitting part to the non-light-emitting part falls within the range of 5:1 to 50:1; and at least one of the auxiliary members placed on the organic EL device has a pattern B that is geometrically similar to the pattern A and includes a light-transmitting part and a light-blocking part. In other words, the display pattern is so formed in the organic EL element that a low contrast ratio, specifically, an emission luminance ratio of 5:1 to 50:1 is obtained, which makes it possible to form the display pattern in a short time without an excessive increase in the power of an ultraviolet irradiation system. In addition, a combination of the organic EL element and the auxiliary member provided thereon and having a pattern formed by a simple method such as printing makes it possible to achieve a final contrast ratio of, for example, at least 200:1, which is expressed as the ratio of the emission luminance of the light-emitting part of the organic EL element to the emission luminance (light-blocking rate) of the light-blocking part formed in the auxiliary member, so that a clear display pattern is successfully formed with high productivity.

DESCRIPTION OF EMBODIMENTS

Figure 1:
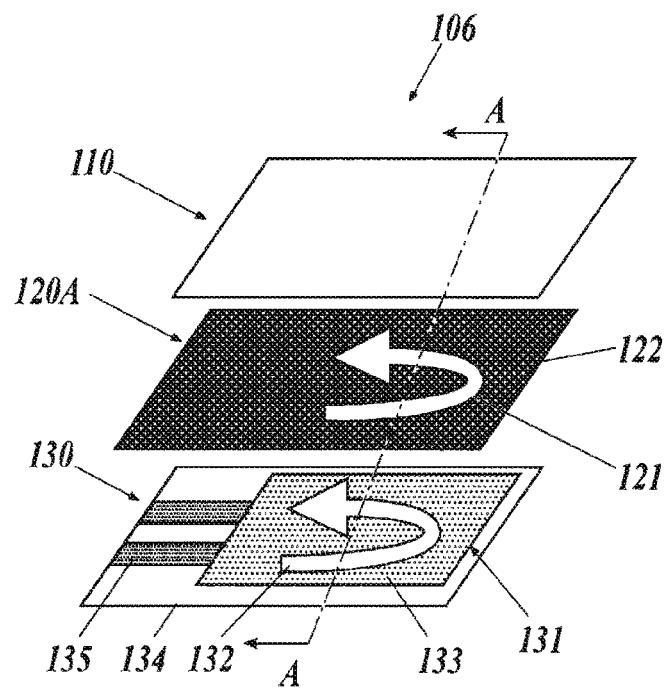
FIG. 1 is a schematic diagram showing an example of the structure of an organic EL panel according to Embodiment 1 of the present invention.

An organic EL panel of the present invention includes an organic EL device and an auxiliary member or members. The organic EL device includes an organic EL element having a pattern A including at least a light-emitting part and a non-light-emitting part. In the organic EL element, the ratio of the emission luminance of the light-emitting part to the emission luminance of the non-light-emitting part is in the range of 5:1 to 50:1. At least one of the auxiliary members has a pattern B being geometrically similar to the pattern A and including a light-transmitting part and a light-blocking part. These features are technical features common to the aspects of the present invention according to claims 1 to 12.

In order to enhance the desired effect of the present invention, a preferred embodiment of the present invention has the features that a light extraction film and a top cover are stacked as the auxiliary members in this order on the organic EL device; an outcoupling film with a high light extraction efficiency is used as the light extraction film; and the pattern B is formed on the front or back side of the outcoupling film. This preferred embodiment makes it possible to provide an organic EL panel having a final display pattern with a higher emission luminance ratio and also having high productivity.

Another preferred embodiment has the features that a light extraction film and a top cover are stacked as the auxiliary members in this order on the organic EL device; and the pattern B is formed on the top cover. This preferred embodiment makes it possible to provide an organic EL panel having a final display pattern with a higher emission luminance ratio and also having high productivity.

A further preferred embodiment has the feature that a top cover with the pattern B printed thereon is provided as the auxiliary member on the organic EL device. This preferred embodiment makes it possible to provide an organic EL panel having a final display pattern with a higher emission luminance ratio and also having high productivity.

The area of the light-emitting part of the pattern A formed in the organic EL element may be made larger than the area of the light-transmitting part of the pattern B formed in or on the auxiliary member. This feature is advantageous in that even when two display patterns are overlaid, uniform display can be achieved without uneven light emission.

The ratio of the total emission luminance of the display part to the total emission luminance of the non-display part in the stack of the organic EL device and the auxiliary member or members is preferably higher than the ratio of the emission luminance of the light-emitting part to the emission luminance of the non-light-emitting part in the organic EL element of the organic EL device, in other words, the display pattern of the final stack preferably has a luminance ratio of higher than 50:1, so that the display pattern such as an icon or a logo pattern can be made clearer.

The present invention is also directed to a method for manufacturing an organic EL panel including: an organic EL device including an organic EL element having a pattern A including a light-emitting part and a non-light-emitting part; and an auxiliary member or members, the method including: forming the light-emitting part and the non-light-emitting part by subjecting to the organic EL element to patterning by exposure to light in such a manner that the contrast ratio (luminance ratio) of the light-emitting part to the non-light-emitting part falls within the range of 5:1 to 50:1; and forming a pattern B in or on at least one of the auxiliary members in such a manner that the pattern B has a shape geometrically similar to the pattern A and includes a light-transmitting part and a light-blocking part.

The pattern A of the organic EL element is preferably formed by batch patterning through a mask using an ultraviolet radiation source, so that the desired pattern can be efficiently formed in the organic EL element.

On the other hand, the pattern B of the auxiliary member is preferably formed by a printing method, so that a high-definition printed pattern can be formed using a simple apparatus.

The information device of the present invention includes a main display screen and a sub display screen, in which the main display screen and the sub display screen are arranged on the same surface side and the sub display screen has an icon display part including at least one organic EL module according to the present invention, or in which the sub display screen is arranged on the surface side opposite to the main display screen and the sub display screen has an icon display part including at least one organic EL module according to the present invention.

Hereinafter, the present invention, the elements of the present invention, and embodiments and aspects for carrying out the present invention will be described in detail. In the description, the word "to" used to indicate numerical ranges means to include the values before and after it as the lower and upper limits. In the description below, the parenthesized number after each element corresponds to the reference sign for each element shown in each drawing.

Hereinafter, a detailed description will be first given of the features of the organic EL panel of the present invention, the organic EL element and the organic EL device as components of the organic EL panel, the patterning method for the organic EL element, a light extraction film (outcoupling film) and a top cover as the auxiliary members, and the patterning method for the auxiliary members. Next, a detailed description will be given of the organic EL module including the organic EL panel of the present invention and given of the whole structure of the information device including the organic EL panel of the present invention.

Figure 9:
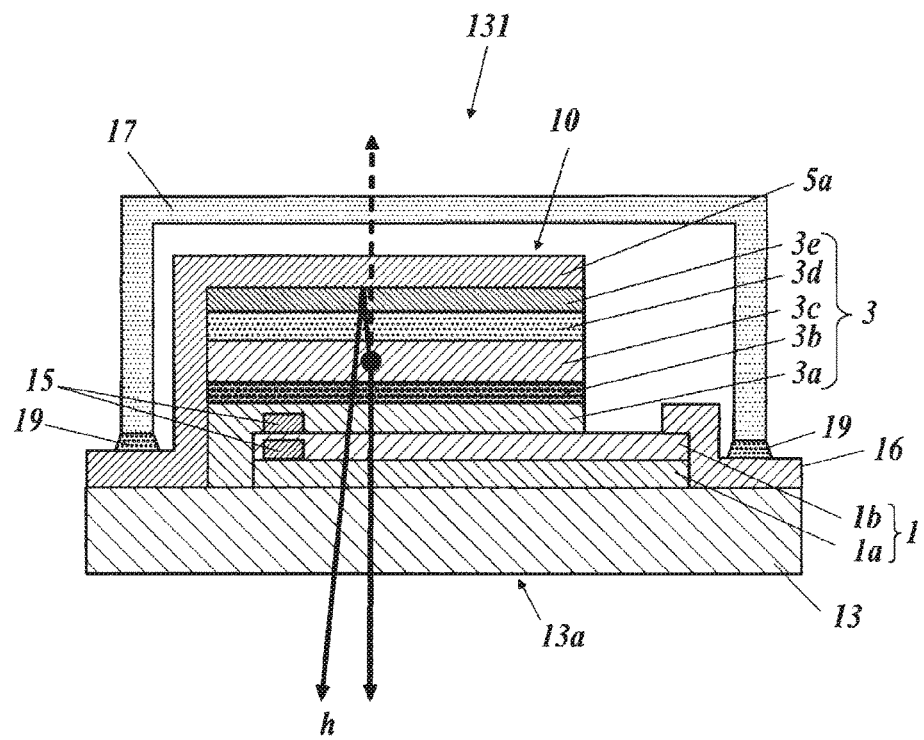
FIG. 9 is a schematic cross-sectional view showing an example of the structure of an organic EL element.

In the present invention, a structure including a base material, an anode, an organic functional layer, a cathode, and a sealing member as shown in FIG. 9 described below is referred to as an organic EL element. In the present invention, a unit including a transparent substrate and the organic EL element and extraction wiring which are formed on the transparent substrate is referred to as an organic EL device. In the present invention, a unit including the patterned organic EL device as a characteristic element of the present invention and an auxiliary member or members having a certain pattern is referred to as an organic EL panel. In the present invention, a unit including the organic EL panel, a flexible printed circuit (hereinafter abbreviated as FPC), and a printed circuit board (hereinafter abbreviated as PCB) is referred to as an organic EL module. In the present invention, a device including the organic EL module is referred to as an information device or a smart device.

<<Features of Organic EL Panel>>

The organic EL panel of the present invention includes an organic EL device and an auxiliary member or members, in which the organic EL device includes an organic EL element having a pattern A including at least a light-emitting part and a non-light-emitting part, the ratio of the emission luminance of the light-emitting part to the emission luminance of the non-light-emitting part in the organic EL element is in the range of 5:1 to 50:1, and at least one of the auxiliary members has a pattern B being geometrically similar to the pattern A and including a light-transmitting part and a light-blocking part.

In the organic EL element according to the present invention, the ratio of the emission luminance of the light-emitting part to the emission luminance of the non-light-emitting part is in the range of 5:1 to 50:1. In the present invention, the term "light-emitting part" refers to a region not having undergone an emission deactivation treatment such as an ultraviolet treatment in the process of forming the organic EL element. On the other hand, in the present invention, the term "non-light-emitting part" refers to a region having undergone an emission deactivation treatment such as an ultraviolet treatment. However, this region is not completely deactivated to the level where no emission occurs, and the non-light-emitting part refers to a region with a reduced emission luminance in the range of 1/50 to 1/5 of the emission luminance of the light-emitting part.

Hereinafter, typical features of the organic EL panel of the present invention will be described with reference to the drawings.

Embodiment 1

A first aspect of the organic EL panel of the present invention includes an organic EL device, a light extraction film, and a top cover. The organic EL device includes an organic EL element having a pattern A including a light-emitting part and a non-light-emitting part. The organic EL element has a ratio of the emission luminance of the light-emitting part to the emission luminance of the non-light-emitting part of 5:1 to 50:1. The light extraction film and the top cover are stacked as the auxiliary members in this order on the organic EL device. The light extraction film is an outcoupling film having a pattern B that includes a light-transmitting part and a light-blocking part and is geometrically similar to the patter A formed in the organic EL element.

FIG. 1 is a schematic diagram showing an organic EL panel according to Embodiment 1 of the present invention.

Referring to FIG. 1, the organic EL panel (106) includes, from the bottom, an organic EL device (130), a light extraction film (120A), and a top cover (110).

The organic EL device (130) includes a transparent base material (134), an organic EL element (131) thereon, and extraction electrodes (135) connected to the anode and the cathode at the end of the organic EL element (131), in which the organic EL element (131) has a pattern A including a light-emitting part (132) and a non-light-emitting part (133) that are formed by ultraviolet irradiation and show an "arrow mark."

In the present invention, the pattern A of the organic EL element (131) has a ratio of the emission luminance of the light-emitting part (132) to the emission luminance of the non-light-emitting part (133) of 5:1 to 50:1, which is relatively low. In other words, the pattern A of the organic EL element (131) is characterized in that the contrast ratio of the image displayed by the light-emitting part (132) and the non-light-emitting part (133) is set relatively low. When the ratio of the emission luminance of the light-emitting part (132) to the emission luminance of the non-light-emitting part (133) is set low in this way, the pattern A can be formed by ultraviolet irradiation in a relatively short time without excess ultraviolet irradiation energy. The features of the organic EL element and the method for forming the pattern A will be described in detail later.

A light extraction film (120A) as a first auxiliary member is provided on the organic EL device (130) including the organic EL element (131) having the pattern A. For example, an outcoupling film is used as the light extraction film (120A). The light extraction film (120A) has a pattern B including a light-transmitting part (121) and a light-blocking part (122), which is the same pattern (e.g., an arrow mark) as that formed in the organic EL element (131).

In the pattern B formed in the light extraction film (120A), the contrast ratio (light transmittance ratio) between the light-transmitting part (121) and the light-blocking part (122) is preferably higher than 50:1, which is the maximum emission luminance ratio between the light-emitting part (132) and the non-light-emitting part (133) of the organic EL element (131).

A top cover (110) as a second auxiliary member is further disposed on the light extraction film (120A) to form the organic EL panel (106).

As shown in FIG. 1, the organic EL element (131) has the pattern A, and the light extraction film (120A) as a first auxiliary member has the pattern B geometrically similar to the pattern A. In this design, the area of the light-emitting part (132) of the pattern (A) is preferably larger than the area of the light-transmitting part of the pattern B of the light extraction film (120A) as the auxiliary member. Specifically, this means that when a comparison is made between the patterns A and B geometrically similar to each other, any part of the pattern A has a larger area or a longer pattern width than the corresponding part of the pattern B.

The organic EL panel (106) illustrated in FIG. 1 is preferably so designed that the ratio of the emission luminance of its display part to the emission luminance of its non-display part is higher than the emission luminance ratio between the light-emitting part (132) and the non-light-emitting part (133) of the organic EL element (131) in the organic EL device (130), specifically, higher than an emission luminance ratio of 50:1. The final emission luminance ratio between the display part and the non-display-part of the organic EL panel (106) is preferably 200:1 or more.

Figure 2:
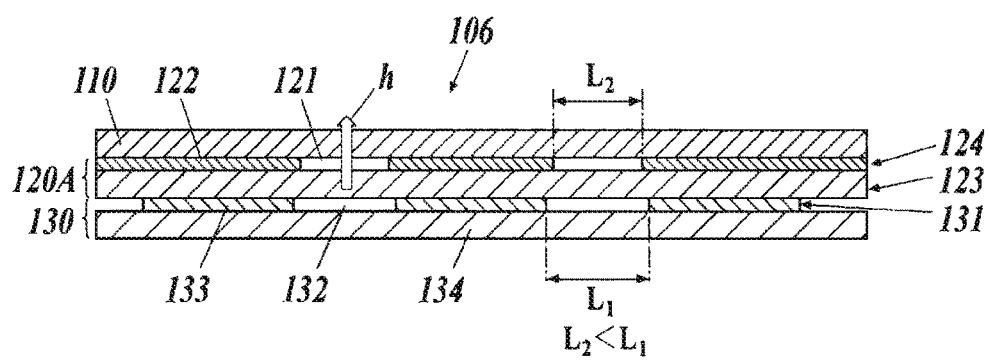
FIG. 2 is a schematic cross-sectional view showing an example of an organic EL panel according to Embodiment 1 of the present invention.

FIG. 2 is an A-A cross-sectional view showing a first example of the structure of the organic EL panel (106) shown in FIG. 1.

In the organic EL panel (106) shown in FIG. 2, the organic EL device (130) having the pattern A is provided as a first component. The organic EL device (130) includes a transparent base material (134) and the organic EL element (131) disposed thereon. The organic EL element (131) includes the light-emitting part (132) and the non-light-emitting part (133) in which the light-emitting function of the organic EL element is controlled by ultraviolet irradiation. The present invention has the feature that the ratio of the emission luminance of the light-emitting part (132) to the emission luminance of the non-light-emitting part (133) is in the range of 5:1 to 50:1.

As mentioned above, the light-emitting part (132) of the organic EL element (131) according to the present invention refers to a region not having undergone an emission deactivation treatment such as an ultraviolet treatment in the process of forming the organic EL element. On the other hand, the non-light-emitting part (133) refers to a region having undergone an emission deactivation treatment such as an ultraviolet treatment. In the present invention, the non-light-emitting part (133) is characterized in that the luminescent material in it is not completely deactivated to the level where no emission occurs and that the emission luminance of it is reduced to 1/50 to 1/5 of the emission luminance of the light-emitting part (132).

The light extraction film (120A) having the pattern B is disposed as a first auxiliary member on the organic EL device (130) having the pattern A.

Referring to FIG. 2, a print layer (124) including an unprinted part as the light-transmitting part (121) and a printed part as a light-blocking part (122) is formed on the upper surface of the light extraction film (123) by a printing method. The method used to form the pattern B is typically, but not limited to, any one appropriately selected from printing methods such as gravure printing, flexographic printing, screen printing, inkjet printing, and photolithography, and vapor deposition. In particular, the pattern B-forming method in the present invention is preferably a screen printing method using an ink composition containing a light-blocking material.

For example, an optically transparent top cover (110) is provided as a second auxiliary member on the light extraction film (120A) to form the organic EL panel (106). In such a structure, light (h) emitted by the organic EL element (131) passes through the light-emitting part (132) of the organic EL element (131) and the light-transmitting part (121) of the light extraction film (120A) and propagates to the front surface side to allow the pattern to be displayed.

In the structure shown in FIG. 2, the width L1 of the light-emitting part (132) formed in the organic EL element (131) is preferably set larger than the width L2 of the light-transmitting part (121) formed in the light extraction film (120A), so that the light-emitting part (132) of the organic EL element (131) with a relatively low emission luminance ratio is masked by the light-blocking part (122) of the light extraction film (120A) and thus not directly displayed on the final display screen. These features are preferred in order to display the pattern more clearly.

Figure 3:
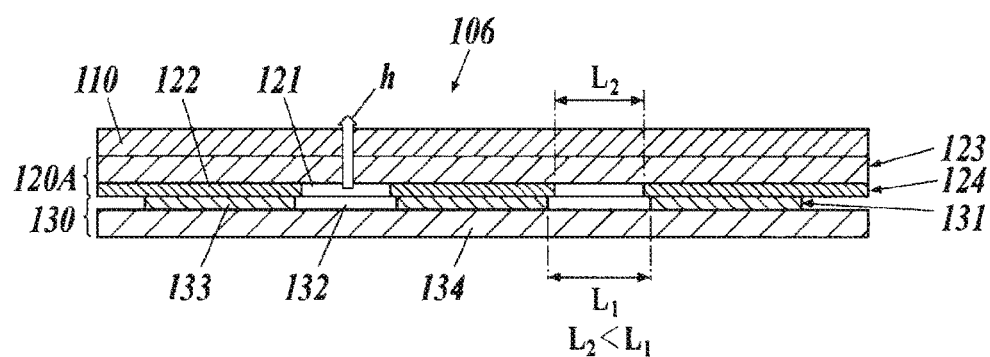
FIG. 3 is a schematic cross-sectional view showing another example of an organic EL panel according to Embodiment 1 of the present invention.

FIG. 3 is an A-A cross-sectional view showing a second example of the structure of the organic EL panel (106) shown in FIG. 1.

In contrast to the first example described above with reference to FIG. 2, the second example of the organic EL panel (106) shown in FIG. 3 has a print layer (124) provided on the lower surface of the light extraction film (120A) and including an unprinted part as a light-transmitting part (121) and a light-blocking part (122). Other features are the same as those described with reference to FIG. 2.

Figure 4:
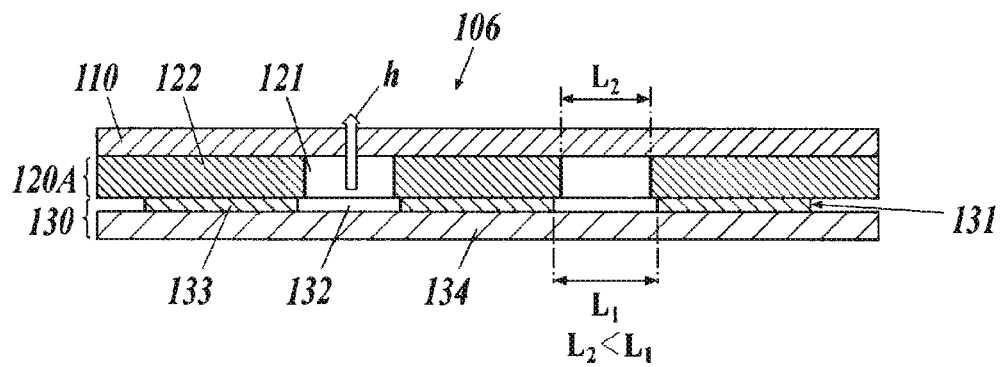
FIG. 4 is a schematic cross-sectional view showing another example of an organic EL panel according to Embodiment 1 of the present invention.

FIG. 4 is an A-A cross-sectional view showing a third example of the structure of the organic EL panel (106) shown in FIG. 1.

In the third example of the organic EL panel (106) shown in FIG. 4, the whole of the light extraction film (120A) is composed of a light-transmitting part (121) and a light-blocking part (122). Other features are the same as those described with reference to FIG. 2.

The specific features of the light extraction film (120A) shown in FIGS. 2 to 4 and the method for forming the light-transmitting part (121) and the light-blocking part (122) will be described in detail later with reference to FIGS. 10 and 11.

When the organic EL panel (106) has the features of Embodiment 1 illustrated in FIGS. 1 to 4 described above, the display pattern (such as icon or logo pattern) of the organic EL panel allows low power consumption, high emission uniformity, and high emission luminance ratio and makes it possible to reduce the manufacturing process time and to provide high productivity.

Embodiment 2

A second aspect of the organic EL panel of the present invention includes an organic EL device, a light extraction film, and a top cover. The organic EL device includes an organic EL element having a pattern A including a light-emitting part and a non-light-emitting part. The organic EL element has a ratio of the emission luminance of the light-emitting part to the emission luminance of the non-light-emitting part of 5:1 to 50:1. The light extraction film and the top cover are stacked as the auxiliary members in this order on the organic EL device, and the top cover has a pattern B that includes a light-transmitting part and a light-blocking part and is geometrically similar to the patter A formed in the organic EL element.

Figure 5:
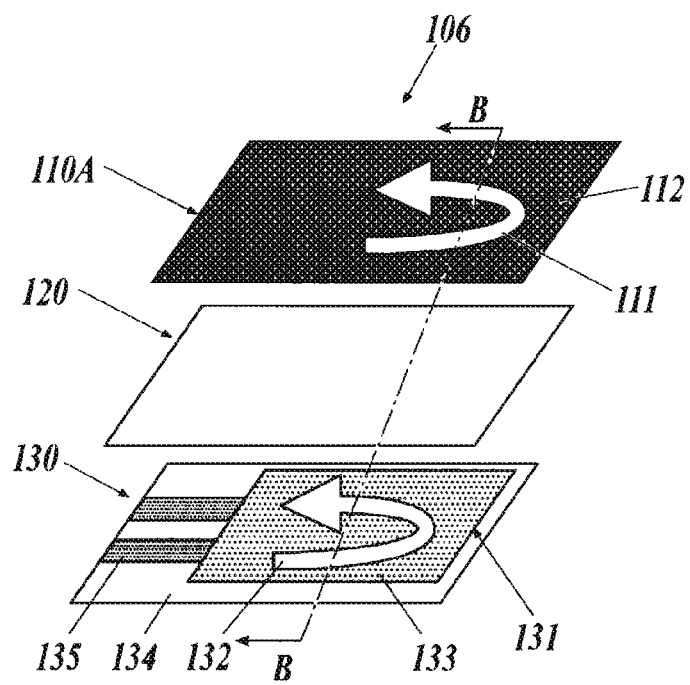
FIG. 5 is a schematic diagram showing an example of the structure of an organic EL panel according to Embodiment 2 of the present invention.

FIG. 5 is a schematic diagram showing the organic EL panel according to Embodiment 2 of the present invention.

The organic EL panel (106) shown in FIG. 5 has the same components as those of the organic EL panel (106) shown in FIG. 1 described above, except that it has the feature that the pattern B including the light-transmitting part and the light-blocking part is formed in or on the top cover (110A).

Therefore, the light extraction film (120) has no print layer and is entirely a light-transmitting region. On the other hand, a print layer having the pattern B including a light-transmitting part (111) and a light-blocking part (112) is formed in or on the top cover (110A) by a printing method, and the top cover (110A) having the pattern B is provided as a component of the panel. The features of the organic EL device (130) having the pattern A are the same as shown in FIG. 1.

Figure 6:
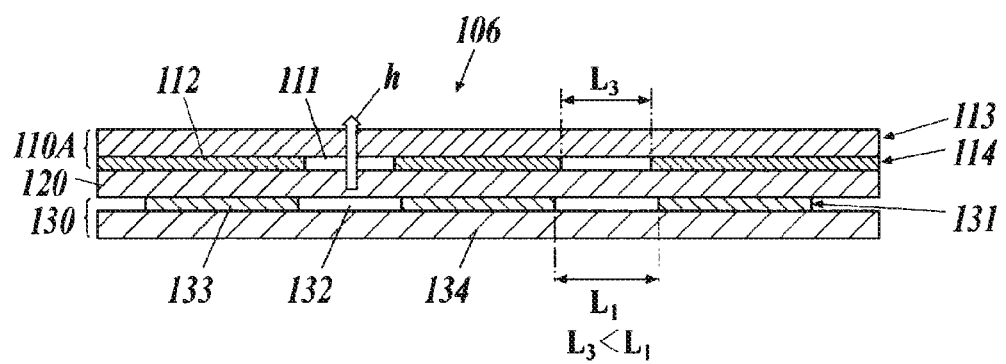
FIG. 6 is a schematic cross-sectional view showing an example of an organic EL panel according to Embodiment 2 of the present invention.

FIG. 6 is a B-B cross-sectional view showing a first example of the structure of the organic EL panel (106) shown in FIG. 5.

The organic EL panel (106) shown in FIG. 6 includes an organic EL device (130) having the same pattern A as shown in FIGS. 2 to 4. The light extraction film (120) is disposed on the organic EL device (130) having the pattern A.

The top cover (110A) having the pattern B is disposed on the light extraction film (120).

In the first example shown in FIG. 6, the top cover (110A) having the pattern B includes a top cover base material (113) and a print layer (114) formed on the lower surface of the top cover base material (113) and including the light-transmitting part (111) and the light-blocking part (112). When the print layer (114) is formed on the lower surface of the top cover base material (113) as an uppermost surface part, the pattern B can be prevented from being flaked off or scratched by touching the surface with fingers.

Also in the structure shown in FIG. 6, like Embodiment 1, the width L1 of the light-emitting part (132) formed in the organic EL element (131) is preferably set larger than the width L3 of the light-transmitting part (111) formed in the top cover (110A), so that the light-emitting part (132) of the organic EL element (131) with a relatively low emission luminance ratio is masked by the light-blocking part (112) of the top cover (110A) and thus not directly displayed on the final display screen.

Figure 7:
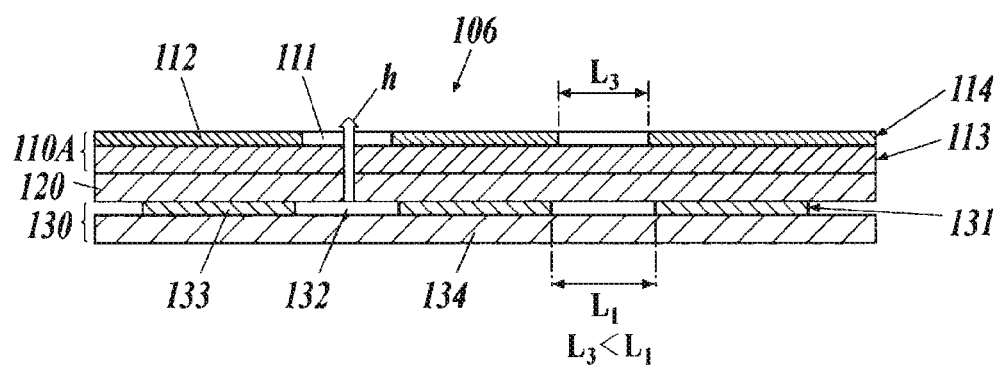
FIG. 7 is a schematic cross-sectional view showing another example of an organic EL panel according to Embodiment 2 of the present invention.

FIG. 7 is a B-B cross-sectional view showing a second example of the structure of the organic EL panel (106) shown in FIG. 5.

The organic EL panel (106) shown in FIG. 7 differs from that shown in FIG. 6 in that a print layer (114) including an unprinted part as a light-transmitting part (111) and a light-blocking part (112) is provided on the upper surface of the top cover base material (113). Other features are the same those shown in FIG. 6.

When the organic EL panel (106) has the features of Embodiment 2 illustrated in FIGS. 5 to 7 described above, the display pattern (such as icon or logo pattern) of the organic EL panel allows low power consumption, high emission uniformity, and high emission luminance ratio and makes it possible to reduce the manufacturing process time and to provide high productivity.

Embodiment 3

A third aspect of the organic EL panel of the present invention includes an organic EL device and a top cover. The organic EL device includes an organic EL element having a pattern A including a light-emitting part and a non-light-emitting part. The organic EL element has a ratio of the emission luminance of the light-emitting part to the emission luminance of the non-light-emitting part of 5:1 to 50:1. The top cover is disposed as the auxiliary member on the organic EL device, and the top cover has a pattern B that includes a light-transmitting part and a light-blocking part and is geometrically similar to the patter A formed in the organic EL element.

Figure 8:
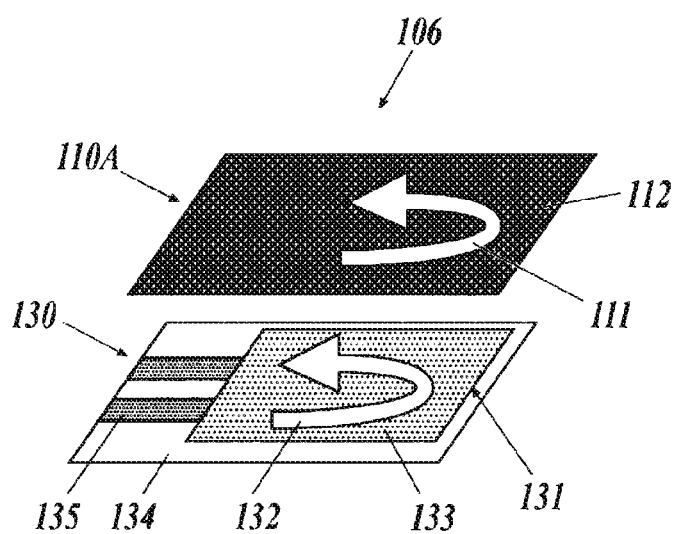
FIG. 8 is a schematic diagram showing an example of the structure of an organic EL panel according to Embodiment 3 of the present invention.

FIG. 8 is a schematic diagram showing the organic EL panel according to Embodiment 3 of the present invention.

The organic EL panel (106) shown in FIG. 8 has the feature that a top cover (110A) having a pattern B including a light-transmitting part and a light-blocking part is disposed directly on the organic EL panel (106) shown in FIG. 1 described above.

The features of the top cover (110A) having the pattern B are the same as those of the top cover (110A) shown in Embodiment 2.

Also when the organic EL panel (106) has the features illustrated in FIG. 8 described above, the display pattern (such as icon or logo pattern) of the organic EL panel allows low power consumption, high emission uniformity, and high emission luminance ratio and makes it possible to reduce the manufacturing process time and to provide high productivity.

<<Components of Organic EL Panel>>

[Organic EL Device]

As shown in FIGS. 1 to 8, the organic EL device (130) according to the present invention mainly includes the transparent base material (134), the organic EL element (131) disposed thereon, and the extraction electrode parts (135) connected to the end of the organic EL element (131).

(Structure of Organic EL Element)

The organic EL element according to the present invention may have any of various structures depending on the purpose. FIG. 9 shows an example thereof. It should be noted that the structure of the organic EL element shown in FIG. 9 has an arrangement reverse to that of the organic EL element (131) shown in FIGS. 1 to 8. Specifically, the light extraction side of the organic EL element (131) shown in FIGS. 1 to 8 is on the upper surface side, whereas in FIG. 9 described below, the light extraction side is shown on the lower surface side for the sake of convenience.

FIG. 9 is a schematic cross-sectional view showing an example of the structure of the organic EL element (131) according to the present invention.

As shown in FIG. 9, the organic EL element (131) includes a resin substrate (13), and a first electrode (1), an organic functional layer unit (3) including an organic material and other components, and a second electrode (5a), which are stacked in this order on the resin substrate (13). An extraction electrode (16) is attached to the end of the first electrode (1). The first electrode (1) is electrically connected to an external power source (not shown) through the extraction electrode (16). The organic EL element (131) is so configured that generated light (emitted light h) is extracted from at least the light extraction surface (13a) of the resin substrate (13).

The layer structure of the organic EL element (131) is not limited and may be of any common type. Typical examples of the layer structure of the organic functional layer unit (3) constituting the organic EL element (131) will be shown below, which, however, are not intended to limit the present invention.

(i) A stack of a hole injection/transport layer, a light-emitting layer, and an electron injection/transport layer (ii) A stack of a hole injection/transport layer, a first light-emitting layer, a second light-emitting layer, and an electron injection/transport layer (iii) A stack of a hole injection/transport layer, a first light-emitting layer, an intermediate layer, a second light-emitting layer, and an electron injection/transport layer (iv) A stack of a hole injection/transport layer, a light-emitting layer, a hole-blocking layer, and an electron injection/transport layer (v) A stack of a hole injection/transport layer, an electron-blocking layer, a light-emitting layer, a hole-blocking layer, and an electron injection/transport layer (vi) A stack of a hole injection layer, a hole transport layer, a light-emitting layer, an electron transport layer, and an electron injection layer (vii) A stack of a hole injection layer, a hole transport layer, a light-emitting layer, a hole-blocking layer, an electron transport layer, and an electron injection layer (viii) A stack of a hole injection layer, a hole transport layer, an electron-blocking layer, a light-emitting layer, a hole-blocking layer, an electron transport layer, and an electron injection layer The structure of the organic EL element (131) shown in FIG. 9 will be described in detail as an example.

In the structure shown in FIG. 9, the first electrode (1), which functions as an anode (or positive electrode), includes an underlying layer (1a) and an electrode layer (1b) formed thereon, and the second electrode (5a) functions as a cathode (or negative electrode). In this case, for example, the organic functional layer unit (3) may include a hole injection layer (3a), a hole transport layer (3b), a light-emitting layer (3c), an electron transport layer (3d), and an electron injection layer (3e) stacked in this order from the first electrode (1) (anode) side, in which the light-emitting layer (3c) including at least an organic material is an essential component. The hole injection layer (3a) and the hole transport layer (3b) may be provided in the form of a hole transport/injection layer. Similarly, the electron transport layer (3d) and the electron injection layer (3e) may be provided in the form of an electron transport/injection layer. In the organic functional layer unit (3), for example, the electron injection layer (3e) may be composed of an inorganic material in some cases.

If necessary, the stack of layers in the organic functional layer unit (3) may also include any other layer such as a hole-blocking layer or an electron-blocking layer. In addition, the light-emitting layer (3c) may have a structure in which color light-emitting layers for emitting light in different wavelength regions, respectively, are stacked with a non-luminescent intermediate layer placed between each pair of adjacent color light-emitting layers. The intermediate layer may also function as a hole-blocking layer or an electron-blocking layer. If necessary, the second electrode (5a) as a cathode may also have a multilayer structure. In the organic EL element (131) with such a structure, only the part of the organic functional layer unit (3) between the first electrode (1) and the second electrode (5a) forms a light-emitting region.

The layer structure described above may also have auxiliary electrodes (15) that are provided in contact with the first electrode (1) to reduce the resistance of the first electrode (1).

The organic EL element (131) with the structure described above is sealed on the resin substrate (13) with a sealant (17), which will be described later, for the purpose of preventing the degradation of the organic functional layer unit (3) including an organic material and other components. The sealant (17) is fixed on the resin substrate (13) side with an adhesive (19) in between. As an exception, the terminal parts for the first electrode (1), the extraction electrode (16), and the second electrode (5a) are exposed on the resin substrate (13) from the sealant (17) while being insulated from one another by the organic functional layer unit (3).

In the organic EL element (131) according to the present invention with the structure described above, a predetermined region of the organic functional layer unit (3) is irradiated with light such as ultraviolet rays at a predetermined dose so that the region is converted to a non-light-emitting part (133) in such a manner that the light-emitting part (132) and the resulting non-light-emitting part (133) form a pattern A having an emission luminance ratio between them of 5:1 to 50:1.

(Method for Manufacturing Organic EL Element)

A method suitable for use in the manufacture of the organic EL element (131) having the light-emitting part (132) and the non-light-emitting part (133) according to the present invention includes the steps of: depositing the first electrode (1), the organic functional layer unit (3), and the second electrode (5a), wherein the organic functional layer unit (3) includes, for example, the hole injection layer (3a), the hole transport layer (3b), the light-emitting layer (3c), the electron transport layer (3d), and the electron injection layer (3e); and performing photoirradiation on a predetermined region of the organic functional layer unit (3).

Now, a method for manufacturing the organic EL element (131) with the structure shown in FIG. 9 will be described as an example of the organic EL element-manufacturing method.

(1) Depositing Step

In the manufacturing method, the organic EL element (131) having the pattern A according to the present invention is manufactured through the step of depositing a first electrode (1), an organic functional layer unit (3), and a second electrode (5a) on a resin substrate (13).

First, a resin substrate (13) is provided, on which an underlying layer (1a) including an nitrogen atom-containing compound is formed with a thickness of 1 µm or less, preferably in the range of 10 to 100 nm, by a thin film-forming method such as vapor deposition.

Subsequently, an electrode layer (1b) (as a component of the first electrode (1)) including silver or a silver-based alloy is formed with a thickness of 12 nm or less, preferably in the range of 4 to 9 nm, on the underlying layer (1a) by a thin film-forming method such as vapor deposition, so that a first electrode (1) as an anode is formed. At the same time, an extraction electrode (16) for connection to an external power source is formed at the end of the first electrode (1) by a thin film-forming method such as vapor deposition.

Subsequently, a hole injection layer (3a), a hole transport layer (3b), a light-emitting layer (3c), an electron transport layer (3d), and an electron injection layer (3e) are sequentially deposited on the resulting first electrode (1) to form an organic functional layer unit (3).

Each of these organic functional layers may be formed by any appropriate method selected from spin coating, casting, inkjet method, vapor deposition, printing, and other methods. Vacuum vapor deposition or spin coating is particularly preferred because it can easily form a uniform layer and is less likely to form pinholes or other defects. The deposition method used may also differ from layer to layer.

When vapor deposition is used to form each organic functional layer, the deposition conditions, although varying with the type of the compound used and other factors, are preferably selected as appropriate from the following common ranges: boat heating temperature 50 to 450° C., the degree of vacuum $1 \times 10^{-6}$ to $1 \times 10^{-2}$ Pa, deposition rate 0.01 to 50 nm/sec, resin substrate temperature −50 to 300° C., layer thickness 0.1 to 5 μm.

After the organic functional layer unit (3) is formed as described above, a second electrode (5a) as a cathode is formed on the top of the unit (3) by any of various thin film-forming methods such as vapor deposition and sputtering, so that an organic EL laminate (10) is formed. In this process, the second electrode (5a) is formed and patterned to have a terminal part extending from the top of the organic functional layer unit (3) to the edge of the resin substrate (13), while it is insulated from the first electrode (1) by the organic functional layer unit (3).

(2) Sealing Step

After the organic EL laminate (10) is formed in the depositing step, the organic functional layer unit (3) is sealed by a sealing step.

Specifically, as shown in FIG. 9, a sealant (17) is provided on the resin substrate (13) to over at least the organic functional layer unit (3) while the terminal part of the extraction electrode (16) connected to the first electrode (1) and the terminal part of the second electrode (5a) are exposed to form extraction electrode parts (135).

(3) Photoirradiation Step

The method for manufacturing the organic EL element (131) according to the present invention is characterized by including the photoirradiation step in which patterning by photoirradiation is preformed to form a pattern A including a light-emitting part (132) and a non-light-emitting part (133) and having an emission luminance ratio between them of 5:1 to 50:1.

As a non-limiting example, the photoirradiation method may be either a method including forming the hole injection layer (3a), the hole transport layer (3b), the electron injection layer (3e), or the electron transport layer (3d) and then performing photoirradiation or a method of subjecting the sealed organic EL element (131) to photoirradiation for patterning the light-emitting area. The latter method, in which the sealed organic EL element (131) can be exposed to the air during photoirradiation, is preferred because it can simplify the photoirradiation step and reduce the manufacturing cost.

In the present invention, the photoirradiation step includes performing photoirradiation on a predetermined region of the organic functional layer unit (3) to be patterned, so that the predetermined region is converted to a non-light-emitting region. This step allows the photo-irradiated region of the organic functional layer unit (3) to lose the light-emitting function, so that the organic EL element (131) having the pattern A is successfully obtained. In other words, the irradiated region becomes the non-light-emitting part (133), and the non-irradiated region becomes the light-emitting part (132), which is similar to that of a conventional organic EL element, so that the desired pattern A is successfully formed.

In the present invention, the photoirradiation may be performed under any conditions appropriate for allowing the ratio of the emission luminance of the light-emitting part (132) to the emission luminance of the non-light-emitting part (133) to fall within the range of 5:1 to 50:1. For example, an emission luminance ratio of 5:1 to 50:1 can be achieved under the conditions (1) where after the photoirradiation, the average drive voltage will be increased by 1.0 V or more under such drive current conditions that a luminance of 1,000 cd/cm$^2$ can be achieved if the photoirradiation is not performed, and the conditions (2) where the rate of change in average current efficiency before and after the photoirradiation will be 20% or less under such drive current conditions that a luminance of 1,000 cd/cm$^2$ can be achieved if the photoirradiation is not performed. These conditions are preferred because they make it possible to form the desired pattern in a short time without excessive photoirradiation power during the patterning and to form the desired pattern for an economical organic EL element in a short lead time for the patterning step and with a small facility load.

In the present invention, the emission luminance ratio can be measured by, for example, the method described below.

A constant current is applied at 2.5 mA/cm$^2$ to the organic EL element having the pattern A under a dry nitrogen gas atmosphere at room temperature (23° C.). The emission luminance is then measured at any 20 points in each of the light-emitting part (132) and the non-light-emitting part (133) using a spectroradiometer CS-1000 (manufactured by Konica Minolta, Inc.). The average of each set of measured values is calculated, and the emission luminance ratio is defined as the ratio between the respective emission luminance averages.

In the present invention, the amount and wavelength of the applied light may be appropriately controlled depending on the materials and properties of the organic EL element being irradiated, so that after the photoirradiation, the average drive voltage can be increased by 1.0 V or more under such drive current conditions that a luminance of 1,000 cd/cm$^2$ can be achieved if the photoirradiation is not performed and so that the rate of change in average current efficiency before and after the photoirradiation can be 20% or less under such drive current conditions that a luminance of 1,000 cd/cm2 can be achieved if the photoirradiation is not performed. A material capable of absorbing the wavelength of the light to be applied may be added to the hole injection layer, the hole transport layer, the electron injection layer, or the electron transport layer. Such a method for increasing the light absorption of the layer may also be used as appropriate.

The higher voltage required to energize the irradiated region than that required to energize the non-irradiated region and the small difference in emission current efficiency between the irradiated region and the non-irradiated region mean that at the same voltage, the efficiency of injection of electrons and holes into the irradiated region is lower than that of injection of electrons and holes into the non-irradiated region.

Therefore, when the organic EL element is driven after subjected to photo-patterning by the photoirradiation satisfying the above conditions, electrons and holes are preferentially injected into the non-irradiated region of the light-emitting area of the organic EL element whereas the amount of injection of electrons and holes into the irradiated region is suppressed.

On the other hand, when the difference in the voltage required for the energization is small between the irradiated and non-irradiated regions, electrons and holes will be injected into both regions.

The efficiency of the power required for the organic EL element to emit light is proportional to (the amount of emitted light)/(the amount of current throughout the element×the voltage), and the amount of emitted light is proportional to the current efficiency. Therefore, the photo-patterned organic EL element provided according to the present invention has no reduction in current efficiency, allows less current to flow through the irradiated region, namely, the region other than the light-emitting region, allows a smaller amount of current to flow throughout it than an organic EL element with a smaller difference in the voltage required for the energization between the irradiated and non-irradiated regions, and has high power efficiency and low power consumption.

In the photoirradiation step according to the present invention, the photoirradiation method is not limited to a specific patterning method and may be any method capable of converting a predetermined region of the organic functional layer unit (3) to a non-light-emitting region by subjecting the predetermined region (to be patterned) to photoirradiation. Preferably, the photoirradiation method includes performing photoirradiation through a partially non-light-transmitting (e.g., non-ultraviolet-transmitting) photomask member with the pattern A to form the light-emitting part (132) and the non-light-emitting part (133).

The light applied in the photoirradiation step may include at least ultraviolet rays and may further include visible light or infrared light. As used herein, the term "ultraviolet ray" refers to electromagnetic waves with a wavelength longer than that of X-rays and shorter than the shortest wavelength of visible light. Specifically, light with a wavelength range of 1 to 400 nm, specifically, with a maximum intensity wavelength of 355 nm, 365 nm, 380 nm, or 405 nm is preferably used for the photoirradiation.

The means for generating and applying light may be based on any method capable of irradiating a predetermined region with light generated using a conventionally known irradiation system.

Examples of light sources suitable for use in the present invention include high-pressure mercury lamps, low-pressure mercury lamps, hydrogen (deuterium) lamps, rare gas (e.g., xenon, argon, helium, or neon) discharge lamps, nitrogen lasers, excimer lasers (e.g., XeCl, XeF, KrF, or KrCl), hydrogen lasers, halogen lasers, and harmonics from various visible (LD)-infrared lasers (e.g., THG (third harmonic generation) light from YAG lasers).

A method of applying laser light may include applying laser light in the form of a spot to the organic functional layer unit (3) and shifting the laser light source and the organic functional layer unit (3) relative to each other to scan the laser irradiation position so that the region to be patterned is irradiated with the light.

The light may also be applied through a mask member. This method may also include covering the light-emitting part (132) of the organic functional layer unit (3) with a mask member and applying light through an optical filter to the whole region of the organic functional layer unit (3) to be patterned.

The photoirradiation step described above is preferably performed after the sealing step. In this case, when the second electrode (5a) is not optically transparent, light is applied from the light extraction surface (13a) side of the resin substrate (13) as a transparent base material. In this case, light is applied to the organic functional layer unit (3) through the resin substrate (13). When the photoirradiation step is performed after the sealing step, the sealed organic EL element (131) may be exposed to the air (open system), and thus the photoirradiation step does not need to be performed in a closed system such as a chamber. This allows the organic EL element with a certain light-emitting pattern to be manufactured by a simple process at low cost.

Alternatively, the photoirradiation step may be performed before the sealing step. In another aspect of the present invention, the photoirradiation may be performed after the deposition of the hole injection layer or the hole transport layer and before the deposition of any other layer, or after the deposition of the electron injection layer or the electron transport layer and before the deposition of any other layer, so that the light-emitting layer will be less likely to be damaged, which is a preferred photoirradiation method in the manufacture of the organic EL element having the specified emission luminance ratio according to the present invention.

The organic EL element having the desired light-emitting pattern is successfully manufactured by the process described above.

In this organic EL element (131)-manufacturing process, a series of steps from the formation of the organic functional layer unit (3) to the formation of the second electrode (5a) are preferably performed on a manufacturing line with a single vacuum step. Alternatively, however, the resin substrate 13 may be taken out of the vacuum atmosphere in the middle of the process, and then subjected to a different deposition method. In such a case, careful measures such as operation under a dry inert gas atmosphere are necessary.

A DC voltage of about 2 to about 40 V may be applied to the organic EL element (131) obtained as described above, in which the first electrode (1) is a plus pole (anode) and the second electrode (5a) is a minus pole (cathode), so that light emission can be observed. Alternatively, an AC voltage may be applied. The AC voltage applied may have any waveform.

Hereinafter, the components of principal layers of the organic EL element (131) described above and methods for manufacturing the same will be described in detail.

(Components of Organic EL Element)

<Resin Substrate>

The resin substrate (hereinafter also referred to as the base, the base material, or the support) suitable for use in the organic EL element according to the present invention may be any type of plastic and may also be transparent or opaque. When light is extracted from the resin substrate side, the resin substrate needs to be transparent. A transparent resin film capable of imparting flexibility to the organic EL element is preferably used as the transparent resin substrate.

In FIG. 9, the resin substrate (13) preferably consists essentially of a resin base material as a support and at least one gas barrier layer with a refractive index in the range of 1.4 to 1.7.

(1) Resin Base Material

In the present invention, the resin base material may be any conventionally known resin film. The resin base material preferably used in the present invention preferably has gas barrier properties such as moisture resistance and gas permeation resistance, which are necessary for the organic EL element.

In the present invention, when the resin substrate (13) side of the organic EL element (131) is used as a light-emitting surface, the resin base material includes a material transparent to visible light. In this case, the light transmittance of the resin base material is preferably 70% or more, more preferably 75% or more, even more preferably 80% or more.

The resin base material also preferably has flexibility. As used herein, the term "flexibility" means that in an environment at 23° C. and 50% RH, the base material placed around a 50 mmφ (diameter) roll, more preferably a 30 mmφ roll, is not cracked or damaged before and after it is taken up around the roll under a certain tension.

In the present invention, a conventionally known base material may be used as the resin base material. For example, the resin base material may be a resin film including an acrylic resin such as acrylic ester, methacrylic ester, or polymethyl methacrylate (PMMA), polyethylene terephthalate (PET), polybutylene terephthalate, polyethylene naphthalate (PEN), polycarbonate (PC), polyarylate, polyvinyl chloride (PVC), polyethylene (PE), polypropylene (PP), polystyrene (PS), nylon (Ny), aromatic polyamide, polyetheretherketone, polysulfone, polyether sulfonate, polyimide, polyether imide, polyolefin, or epoxy resin. A resin film including cycloolefin- or cellulose ester-based resin may also be used. The base material may also be a heat-resistant transparent film (Sila-DEC (product name) manufactured by Chisso Corporation) having an organic-inorganic hybrid structure with a silsesquioxane basic skeleton or a laminated resin film having a stack of two or more layers of any of the above resin materials.

In view of cost or easy availability, PET, PEN, PC, or acrylic resin is preferably used.

In particular, a biaxially-stretched polyethylene terephthalate film or a biaxially-stretched polyethylene naphthalate film is preferred in view of transparency, heat resistance, ease of handling, strength, and cost.

The resin base material is most preferably a less heat-shrinkable product having undergone thermal annealing or any other treatment for further minimizing the shrinkage after thermal expansion.

The resin base material preferably has a thickness in the range of 10 to 500 µm, more preferably in the range of 20 to 250 µm, even more preferably in the range of 30 to 150 µm. The resin base material with a thickness in the range of 10 to 500 µm can have stable gas barrier properties and be suitable for roll to roll feeding.

(2) Gas Barrier Layer

<2.1> Properties and Formation Method

In the present invention, at least one gas barrier layer (low-refractive-index layer) with a refractive index in the range of 1.4 to 1.7 may also be provided on the resin substrate (13). Such a gas barrier layer may be made of any known material. Such a gas barrier layer may be a coating including an inorganic or organic material or a hybrid coating including a combination of inorganic and organic coatings. The gas barrier layer is preferably a gas barrier film having a water-vapor permeability of 0.01 $g/(m^2 \cdot 24\ h)$ or less as measured by the method according to JIS K 7129: 1992 (25±0.5° C., relative humidity 90±2% RH). The gas barrier layer is more preferably a high gas barrier film having an oxygen permeability of $1 \times 10^{-3}$ $ml/(m^2 \cdot 24\ h \cdot atm)$ or less as measured by the method according to JIS K 7126:1987 and a water-vapor permeability of $1 \times 10^{-5}$ $g/(m^2 \cdot 24\ h)$ or less.

The gas barrier layer with such features may be made of any material having the function of inhibiting the infiltration of water, oxygen, and other substances capable of inducing degradation of the element. For example, silicon oxide, silicon dioxide, or silicon nitride may be used to form the gas barrier layer. The gas barrier film may also have a multilayer structure of such an inorganic layer and an organic material layer as a stress relaxation layer so that the brittleness of the gas barrier layer can be reduced. The inorganic and organic layers may be stacked in any order. Preferably, both are alternately stacked a plurality of times.

The gas barrier layer may be formed using any method such vacuum deposition, sputtering, reactive sputtering, molecular beam epitaxy, ionized-cluster beam technique, ion plating, plasma polymerization, atmospheric pressure plasma polymerization, plasma CVD, laser CVD, thermal CVD, or coating.

<2.2> Formation Method Using Inorganic Precursor Compound

Alternatively to the above deposition methods, the gas barrier layer may also be formed by a method that includes applying an inorganic precursor compound-containing coating liquid onto the resin base material to format least one coating and then subjecting the coating to a modification treatment with an excimer lamp or the like to form an inorganic layer (gas barrier layer).

The method of application may be a conventionally known wet coating method such as roller coating, flow coating, inkjet method, spray coating, printing, dip coating, cast coating, bar coating, or gravure printing.

The thickness of the coating may be appropriately selected depending on the purpose. For example, the thickness of the coating is preferably so selected that its post-drying thickness will fall within the range of 0.001 to 10 µm, more preferably within the range of 0.01 to 10 µm, most preferably within the range of 0.03 to 1 µm.

The inorganic precursor compound for use in the present invention may be any compound capable of forming a metal oxide, a metal nitride, or a metal oxynitride upon exposure to ultraviolet rays (excimer light) under a specific atmosphere. In the present invention, compounds suitable to form the gas barrier layer preferably include compounds capable of undergoing the modification treatment at relatively low temperature, such as those described in JP 08-112879 A.

Specific examples of such compounds include polysiloxane having Si—O—Si bonding (including polysilsesquioxane), polysilazane having Si—N—Si bonding, and polysiloxazane having both Si—O—Si bonding and Si—N—Si bonding. Two or more of these compounds may be used in the form of a mixture. A stack of layers of different compounds, sequentially or simultaneously formed, may also be used.

[First Electrode (Transparent Electrode)]

The first electrode (1) as a component of the organic EL element according the present invention may be generally of any type usable for organic EL elements. Specifically, the first electrode (1) may include aluminum, silver, magnesium, lithium, a magnesium-copper mixture, a magnesium-silver mixture, a magnesium-aluminum mixture, a magnesium-indium mixture, indium, a lithium-aluminum mixture, a rare earth metal, or an oxide semiconductor such as ITO, ZnO, $TiO_2$, or $SnO_2$.

In the present invention, the first electrode is preferably a transparent electrode.

For example, as shown in FIG. 9, the first electrode (1) has a two-layer structure including an underlying layer (1a) and an electrode layer (1b) deposited thereon, which are stacked in order from the transparent substrate (13) side. In this structure, the electrode layer (1b) includes silver or an alloy including silver as a main component, and the underlying layer (1a) includes, for example, a nitrogen atom-containing compound.

Regarding the first electrode (1), the term "transparent" means that it has a light transmittance of 50% or more at a wavelength of 550 nm. Regarding the electrode layer (1b), the term "including silver as a main component" means that the content of silver in the electrode layer (1b) is 98% by weight or more.

(1) Underlying Layer

The underlying layer (1a) is provided on the transparent substrate (13) side of the electrode layer (1b). The material used to form the underlying layer (1a) is not limited. The underlying layer (1a) may include any material capable of suppressing the aggregation of silver in the process of forming the electrode layer (1b) including silver or an alloy including silver as a main component. Such a material may be, for example, a nitrogen atom-containing compound.

(2) Electrode Layer

The electrode layer (1b) includes silver or a silver alloy including silver as a main component. The electrode layer (1b) is preferably deposited on the underlying layer (1a).

The electrode layer (1b) with such features may be deposited by a method using a wet process such as application, inkjet method, coating, or dipping or by a method using a dry process such as vapor deposition (such as resistive heating or EB deposition), sputtering, or CVD. In particular, vapor deposition is preferably used.

[Organic Functional Layer Unit]

(1) Light-Emitting Layer

The organic functional layer unit (3) includes at least the light-emitting layer (3c).

The light-emitting layer (3c) used in the present invention preferably contains a phosphorescent compound as a luminescent material. A fluorescent material may also be used as a luminescent material, and a phosphorescent compound may also be used in combination with a fluorescent material.

The light-emitting layer (3c) is a layer capable of emitting light by recombination of electrons and holes injected from the electrode or the electron transport layer (3d) and the hole transport layer (3b), respectively. The light-emitting part may be inside the light-emitting layer (3c) or at the interface between the light-emitting layer (3c) and the adjacent layer.

The light-emitting layer (3c) with such features may have any structure as long as the luminescent material therein satisfies the conditions necessary for the light emission. A plurality of light-emitting layers (3c) may also be provided having the same emission spectrum or emission maximum wavelength. In this case, a non-luminescent intermediate layer (not shown) is preferably provided between each pair of light-emitting layers (3c).

The total thickness of the light-emitting layer or layers (3c) is preferably in the range of 1 to 100 nm, more preferably in the range of 1 to 40 nm so that a lower drive voltage can be achieved.

In this regard, when a non-luminescent intermediate layer is provided between the light-emitting layers 3c, the thickness of the intermediate layer is included as part of the total thickness of the light-emitting layers (3c). A plurality of light-emitting layer units may be stacked with an intermediate connector part placed between each pair of adjacent units to form what is called a tandem-type element. In this case, the term "light-emitting layer" refers to the light-emitting layer part in each light-emitting unit.

When a plurality of light-emitting layers (3c) are stacked, the thickness of each light-emitting layer is preferably controlled to fall within the range of 1 to 50 nm, more preferably within the rage of 1 to 20 nm. A plurality of stacked light-emitting layers may correspond to blue, green, and red emission colors, respectively. In this case, there is no limitation on the relationship between the thicknesses of the blue, green, and red emission layers.

The light-emitting layer (3c) described above can be formed by subjecting a known luminescent material or a known host compound to a known thin film-forming method such as vacuum vapor deposition, spin coating, casting, LB method, or inkjet method.

The light-emitting layer (3c) may also include a mixture of a plurality of luminescent materials.

The light-emitting layer 3c preferably includes a host compound (also referred to as a light-emitting host or the like) and a luminescent material (also referred to as a light-emitting dopant), in which light is preferably emitted from the luminescent material.

Examples of the light-emitting dopant that may be used in the present invention include the compounds described in WO 2005/076380 A, WO 2010/032663 A, WO 2008/140115 A, WO 2007/052431 A, WO 2011/134013 A, WO 2011/157339 A, WO 2010/086089 A, WO 2009/113646 A, WO 2012/020327 A, WO 2011/051404 A, WO 2011/004639 A, WO 2011/073149 A, JP 2012-069737 A, JP 2009-114086 A, JP 2003-81988 A, JP 2002-302671 A, and JP 2002-363552 A.

Examples of the host compound include the compounds described in JP 2001-257076 A, JP 2002-308855 A, JP 2001-313179 A, JP 2002-319491 A, JP 2001-357977 A, JP 2002-334786 A, JP 2002-8860 A, JP 2002-334787 A, JP 2002-15871 A, JP 2002-334788 A, JP 2002-43056 A, JP 2002-334789 A, JP 2002-75645 A, JP 2002-338579 A, JP 2002-105445 A, JP 2002-343568 A, JP 2002-141173 A, JP 2002-352957 A, JP 2002-203683 A, JP 2002-363227 A, JP 2002-231453 A, JP 2003-3165 A, JP 2002-234888 A, JP 2003-27048 A, JP 2002-255934 A, JP 2002-260861 A, JP 2002-280183 A, JP 2002-299060 A, JP 2002-302516 A, JP 2002-305083 A, JP 2002-305084 A, JP 2002-308837 A, US 2003/0,175,553 A, US 2006/0,280,965 A, US 2005/0,112,407 A, US 2009/0,017,330 A, US 2009/0,030,202 A, US 2005/0,238,919 A, WO 2001/039234 A, WO 2009/021126 A, WO 2008/056746 A, WO 2004/093207 A, WO 2005/089025 A, WO 2007/063796 A, WO 2007/063754 A, WO 2004/107822 A, WO 2005/030900 A, WO 2006/114966 A, WO 2009/086028 A, WO 2009/003898 A, WO 2012/023947 A, JP 2008-074939 A, JP 2007-254297 A, and EP 2034538 A.

(2) Injection Layer

The injection layer is a layer provided between the electrode and the light-emitting layer (3c) so as to reduce the drive voltage or improve the emission luminance. Such a layer is described in detail in "Organic EL Devices and Forefront of Their Industrialization", published by NTS Inc., Nov. 30, 1998, Part 2, Chapter 2, "Denkyoku Zairyou" (Electrode Materials), pages 123-166. Examples include a hole injection layer (3a) and an electron injection layer (3e).

The injection layer is an optional component layer. The hole injection layer (3a) may be provided between the anode and the light-emitting layer (3c) or a hole transport layer (3b). The electron injection layer (3e) may be provided between the cathode and the light-emitting layer (3c) or an electron transport layer (3d).

The hole injection layer (3a) is also described in detail in publications such as JP 09-45479 A, JP 09-260062 A, and JP 08-288069 A. Examples include a layer of a phthalocyanine such as copper phthalocyanine, a layer of an oxide such as vanadium oxide, an amorphous carbon layer, and a polymer layer including a conductive polymer such as polyaniline (Emeraldine) or polythiophene. The materials described in JP 2003-519432 W are also preferably used.

The electron injection layer (3e) is also described in detail in publications such as JP 06-325871 A, JP 09-17574 A, and JP 10-74586 A. Examples include a layer of a metal such as strontium or aluminum, a layer of an alkali metal halide such as potassium fluoride, a layer of an alkaline-earth metal compound such as magnesium fluoride, and a layer of an oxide such as molybdenum oxide. In the present invention, the electron injection layer (3e) is preferably a very thin film whose thickness is preferably in the range of 1 nm to 10 μm although it depends on the material.

(3) Hole Transport Layer

The hole transport layer (3b) includes a hole transport material having the function of transporting holes. In abroad sense, the hole injection layer (3a) and an electron-blocking layer fall within the category of the hole transport layer (3b). The hole transport layer (3b) may be a single layer or a multilayer structure.

The hole transport material has one of the ability to inject or transport holes and the ability to block electrons. The hole transport material may be any of organic and inorganic materials. Examples include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline-based copolymers, and conductive high-molecular oligomers, specifically, thiophene oligomers.

The hole transport material may be any of the above materials. Preferably, the hole transport material is any of a porphyrin compound, an aromatic tertiary amine compound, and a styrylamine compound. In particular, an aromatic tertiary amine compound is preferably used.

Typical examples of the aromatic tertiary amine compound and the styrylamine compound include N,N,N',N'-tetraphenyl-4,4'-diaminophenyl, N,N'-diphenyl-N,N'-bis(3-methylphenyl)-[1,1'-biphenyl]-4,4'-diamine (abbreviated as TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostilbenzene, N-phenylcarbazole, compounds described in U.S. Pat. No. 5,061,569, having two condensed aromatic rings in their molecule, such as 4,4'-bis[N-(1-naphthyl)-N-phenylamino]biphenyl (abbreviated as NPD), and compounds described in JP 04-308688 A, having three triphenylamine units linked in a starburst manner, such as 4,4',4"-tris[N-(3-methylphenyl)-N-phenylamino]triphenylamine (abbreviated as MTDATA).

Polymer materials having any of these materials incorporated in the polymer chain or polymer materials whose main chain is formed using any of these materials may also be used. In addition, p-type Si and inorganic compounds such as p-type SiC may also be used as hole injection or transport materials.

In addition, materials described in JP 11-251067 A and J. Huang et. al., Applied Physics Letters, 80 (2002), p. 139 may also be used, such as what are called p-type hole transport materials. In the present invention, these materials are preferably used because they can form high-efficiency light-emitting elements.

The hole transport layer (3b) can be formed by subjecting any of the above hole transport materials to a known thin film forming method such as vacuum vapor deposition, spin coating, casting, printing methods including inkjet method, or LB method. The thickness of the hole transport layer (3b) is generally, but not limited to, about 5 nm to about 5 μm, preferably 5 to 200 nm. The hole transport layer 3b may be a single layer structure including one or more of the above materials.

The material for the hole transport layer (3b) may also be doped with an impurity for increasing the transportability. Examples of such an impurity include those described in JP 04-297076 A, JP 2000-196140 A, JP 2001-102175 A, and J. Appl. Phys., 95, 5773 (2004).

(4) Electron Transport Layer

The electron transport layer (3d) includes a material having the function of transporting electrons. In a broad sense, the electron injection layer (3e) and a hole-blocking layer (not shown) fall within the category of the electron transport layer (3d). The electron transport layer (3d) may be formed as a single layer structure or a multilayer structure.

In the electron transport layer (3d) of a single layer structure or a multilayer structure, the electron transport material (also serving as a hole-blocking material) constituting the layer part adjacent to the light-emitting layer (3c) only needs to have the function of transmitting electrons to the light-emitting layer (3c) when the electrons are injected from the cathode. The material with such properties may be any material selected from conventionally known compounds. Examples of such compounds include nitro-substituted fluoren derivatives, diphenylquinone derivatives, thiopyran dioxide derivatives, carbodiimide, fluorenylidenemethane derivatives, anthraquinodimethane, anthrone derivatives, and oxadiazole derivatives. Materials that may be used for the electron transport layer 3d also include thiadiazole derivatives derived from the oxadiazole derivatives by replacing the oxygen atom in the oxadiazole ring with a sulfur atom; and quinoxaline derivatives having a quinoxaline ring known as an electron-withdrawing group. Polymer materials having any of these materials incorporated in the polymer chain or polymer materials whose main chain is formed using any of these materials may also be used.

Materials that may be used for the electron transport layer 3d also include 8-quinolinol derivative metal complexes such as tris(8-quinolinol)aluminum (abbreviated as Alq$_3$), tris(5, 7-dichloro-8-quinolinol)aluminum, tris(5,7-dibromo-8-quinolinol)aluminum, tris(2-methyl-8-quinolinol)aluminum, tris(5-methyl-8-quinolinol)aluminum, and bis(8-quinolinol)zinc (abbreviated as Znq), and metal complexes derived from any of these metal complexes by replacing the central metal with In, Mg, Cu, Ca, Sn, Ga, or Pb.

The electron transport layer (3d) can be formed by subjecting any of the above materials to a known thin film forming method such as vacuum vapor deposition, spin coating, casting, printing methods including inkjet method, or LB method. The thickness of the electron transport layer (3d) is generally, but not limited to, about 5 nm to about 5 μm, preferably 5 to 200 nm. The electron transport layer (3d) may be a single layer structure including one or more of the above materials.

(5) Blocking Layer

Examples of the blocking layer include a hole-blocking layer and an electron-blocking layer. The organic functional layer unit 3 may further include the blocking layer in addition to each functional layer described above. For example, JP 11-204258 A, JP 11-204359 A, and "Organic EL Devices and Forefront of Their Industrialization", published by NTS Inc., Nov. 30, 1998, page 237 describe hole-blocking (hole-block) layers.

In a broad sense, the hole-blocking layer has the function of an electron transport layer (3d). The hole-blocking layer includes a hole-blocking material having the function of transporting electrons and a very low ability to transport holes so that it can increase the probability of recombination of electrons and holes by transporting electrons and blocking holes. If necessary, the composition of the electron transport layer (3d) may be used to form the hole-blocking layer. The hole-blocking layer is preferably provided adjacent to the light-emitting layer (3c).

In a broad sense, the electron-blocking layer has the function of a hole transport layer (3b). The electron-blocking layer includes a material having the function of transporting holes and a very low ability to transport electrons so that it can increase the probability of recombination of electrons and holes by transporting holes and blocking electrons. If necessary, the composition of the hole transport layer (3b) may be used to form the electron-blocking layer.

In the present invention, the hole-blocking layer preferably has a thickness in the range of 3 to 100 nm, more preferably in the range of 5 to 30 nm.

(Second Electrode)

The second electrode (5a) is an electrode film provided to function as a cathode for supplying electrons to the organic functional layer unit (3). Any of metals, alloys, organic or inorganic conductive compounds, and mixtures thereof may be used to form the second electrode (5a). Specifically, such materials include aluminum, silver, magnesium, lithium, a magnesium-copper mixture, a magnesium-silver mixture, a magnesium-aluminum mixture, a magnesium-indium mixture, indium, a lithium-aluminum mixture, rare earth metals, and oxide semiconductors such as indium-doped tin oxide (ITO), ZnO, $TiO_2$, and $SnO_2$.

The second electrode (5a) can be produced by forming a thin film of any of these conductive materials by vapor deposition, sputtering, or other methods. The sheet resistance of the second electrode (5a) is preferably not more than several hundred $\Omega/\square$, and its thickness is generally selected in the range of 5 nm to 5 μm, preferably in the range of 5 to 200 nm.

(Extraction Electrode)

The extraction electrode is provided to electrically connect the first electrode (1) to an external power source. The material for the extraction electrode is not limited, and a known electrode material is preferably used to form the extraction electrode. The extraction electrode may be, for example, a metal film such as an MAM electrode with a three-layer structure (Mo/Al—Nd alloy/Mo).

(Auxiliary Electrode)

The auxiliary electrode (15), which is provided to reduce the resistance of the first electrode (1), is provided in contact with the electrode layer (1b) of the first electrode (1). The auxiliary electrode (15) is preferably made of a low-resistance metal material such as gold, platinum, silver, copper, or aluminum. Since these metal materials have low optical transparency, the auxiliary electrode (15) is patterned so that the extraction of emitted light (h) from the light extraction surface 13a will not be affected.

The auxiliary electrode (15) with such properties may be formed by vapor deposition, sputtering, printing, inkjet method, aerosol jetting, or other methods. In view of the numerical aperture for light extraction, the auxiliary electrode 15 preferably has a line width of 50 μm or less. In view of conductivity, the auxiliary electrode (15) preferably has a thickness of 1 μm or more.

(Sealant)

As shown in FIG. 9, the sealant (17) may be disposed over the display region of the organic EL laminate (10) in the organic EL element (131). The sealant (17) may be concave sheet-shaped or flat sheet-shaped. The sealant may also have any level of transparency and electrical insulating properties.

As an example, the sealant (17) shown in FIG. 9 will be described in detail. The sealant (17) is provided to cover the organic EL laminate (10). The sealant (17) may be a sheet-shaped (film-shaped) sealing member, which is bonded to the resin substrate (13) side with an adhesive (19), or a sealing film. In such a case, for example, as illustrated in FIG. 9, the sealant (17) is provided to cover at least the organic functional layer unit (3) of the organic EL element (131) while the terminal parts of the extraction electrode (16) connected to the first electrode (1) and the terminal part of the second electrode (5a) are exposed. The sealant (17) may also be provided with electrodes, and the terminal parts of the first electrode (1) and the second electrode (5a) of the organic EL element (131) may be electrically connected to the electrodes, respectively.

The material used to form the sheet-shaped (film-shaped) sealant may be, for example, a glass sheet, a polymer sheet/film, or a metal sheet/film. Specifically, the glass sheet may include soda-lime glass, barium/strontium-containing glass, lead glass, aluminosilicate glass, borosilicate glass, barium borosilicate glass, or quartz. The polymer sheet may include polycarbonate, acrylic, polyethylene terephthalate, polyether sulfide, or polysulfone. The metal sheet may include at least one metal selected from the group consisting of stainless steel, iron, copper, aluminum, magnesium, nickel, zinc, chromium, titanium, molybdenum, silicon, germanium, and tantalum, and alloys thereof.

In particular, a thin film of the polymer or metal substrate is preferably used as the sealant (17), so that the organic EL element can be made thin.

In addition, such a film of the polymer substrate preferably has an oxygen permeability of $1 \times 10^{-3}$ ml/(m$^2 \cdot$24 h·atm) or less as measured by the method according to JIS K 7126:1987 and a water-vapor permeability of $1 \times 10^{-3}$ g/(m$^2 \cdot$24 h) or less (25±0.5° C., relative humidity 90±2% RH) as measured by the method according to JIS K 7129: 1992.

As shown in FIG. 9, an adhesive (19) is used to bond the sheet-shaped sealant (17) to the resin substrate (13) side. The adhesive (19) is used as a sealing agent for sealing the organic EL laminate (10) sandwiched between the sealant (17) and the resin substrate (13). Specifically, the adhesive (19) may be a photo-curing or thermosetting adhesive having a reactive vinyl group, such as an acrylic acid oligomer or a methacrylic acid oligomer, or a moisture-curing adhesive such as 2-cyanoacrylic acid ester.

Alternatively, the adhesive (19) may be of a thermosetting and chemical setting type (two-part mixing type) such as an epoxy adhesive. A hot melt adhesive such as polyamide, polyester, or polyolefin may also be used. A cationically-curable or ultraviolet-curable epoxy resin adhesive may also be used.

(Other Component Layers)

Although not shown in FIG. 9, a protective film or a protective sheet may also be provided on the surface opposite to the resin substrate (13) across the organic functional layer (3). If necessary, a polarizing member, a half mirror member, a black filter, or any other optional member may also be provided.

[Organic EL Module]

The organic EL module (115) includes the organic EL panel (106) described above, and a flexible printed circuit FPC (107) and a printed circuit board PCB as electrical connection units.

Figure 10:
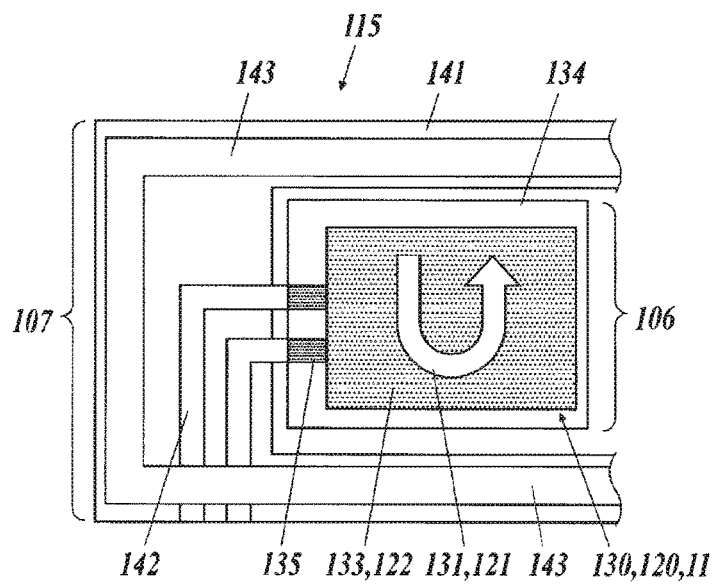
FIG. 10 is a schematic top view showing an example of the structure of an organic EL module.

FIG. 10 is a schematic top view showing an example of the structure of the organic EL module having the organic EL panel according to the present invention.

FIG. 10 shows how wiring is provided between the organic EL panel (106) having a specific display pattern and the flexible printed circuit (107) in the organic EL module (115) and omits showing the printed circuit board (PCB).

The flexible printed circuit FPC (107) includes a flexible substrate (141), a wiring circuit part (142) for supplying a drive current through the extraction wirings (135) of the organic EL element, and a capacitive detection circuit part (143) for function as a touch sensor.

The flexible substrate (141) used to form the flexible printed circuit FPC (107) may be any plastic material having transparency, flexibility, and sufficient mechanical strength. Examples of such a material include polyimide resin (PI), polycarbonate resin, polyethylene terephthalate resin (PET), polyethylene naphthalate resin (PEN), and cycloolefin resin (COP), among which polyimide resin (PI), polyethylene terephthalate resin (PET), and polyethylene naphthalate resin (PEN) are preferred.

The wiring circuit part (142) and the detection circuit part (143) preferably include a conductive metal material, such as gold, silver, copper, or ITO. In the present invention, they are preferably made of copper.

[Light Extraction Film]

It is generally said that an organic EL element emits light inside a layer with a refractive index (in the range of about 1.6 to about 2.1) higher than that of the air and only about 15% to about 20% can be extracted from the light emitted by the light-emitting layer. This is because the light incident at an angle δ equal to or greater than the critical angle on the interface (the interface between the resin substrate and the air) undergoes total reflection and thus cannot be extracted to outside the element, light can undergo total reflection between the transparent electrode or the light-emitting layer and the resin substrate, and light can be guided through the transparent electrode or the light-emitting layer and thus can escape towards the side surface of the organic EL element.

In the organic EL panel according to the present invention, a light extraction film is preferably provided as means for improving the light extraction efficiency on the organic EL device. The light extraction film is also called an outcoupling film (OCF).

The light extraction method may be, for example, a method of forming irregularities on the surface of the film substrate to prevent total reflection at the interface between the resin substrate and the air (e.g., the method described in U.S. Pat. No. 4,774,435), a method of imparting alight converging ability to the substrate to improve the efficiency (e.g., the method described in JP 63-314795 A), a method of forming a reflecting surface on the side or other part of the element (e.g., the method described in JP 01-220394 A), a method of introducing, between the substrate and the light-emitting part, a flat layer with an intermediate refractive index to form an antireflection film (e.g., the method described in JP 62-172691 A), a method of introducing, between the substrate and the light-emitting part, a flat layer with a refractive index lower than that of the substrate (e.g., the method described in JP 2001-202827 A), a method of forming a diffraction grating at the interface of the substrate, the transparent electrode layer, or the light-emitting layer (between the substrate and the outside) (the method described in JP 11-283751 A), or a method of providing, between the substrate and the light-emitting part, a scattering layer having a refractive index higher than that of the organic layer or the substrate.

In the organic EL panel according to the present invention, the outcoupling film (OCF) may be, for example, a microlens film having a large number of microlens structures on its light extraction side, a lenticular film, a light-scattering film containing light-scattering fine particles, a diffusion film having undergone a process of forming random irregularities on its surface, a film having an internal refractive index distribution, or a light diffusion film containing a diffraction grating layer, examples of which include those described in detail in JP 2822983 B1, JP 2001-33783 A, JP 2001-56461 A, JP 06-18706 A, JP 10-20103 A, JP 11-160505 A, JP 11-305010 A, JP 11-326608 A, JP 2000-121809 A, JP 2000-180611 A, and JP 2000-338310 A. In particular, a light-scattering film containing fine particles is preferably used, which is inexpensive and mass-producible.

Fine particles suitable for use in such a light-scattering film include inorganic metal fine particles (e.g., silica fine particles) or optically transparent resin fine particles.

According to the present invention, a print layer having a pattern B including a light-transmitting part and a light-blocking part is formed on the upper or lower surface of the light extraction film such as an OCF or in the light extraction film such as an OCF. The pattern B may be formed using a method appropriately selected from printing methods such as gravure printing, flexographic printing, screen printing, inkjet printing, and photolithography, and vapor deposition. Particularly in the present invention, the pattern B is preferably formed by screen printing using an ink composition containing a light-blocking material.

Next, methods for forming, on an OCF, the pattern B including the transmitting part (121) and the light-blocking part (122) will be described with reference to the drawings.

Figure 11A:
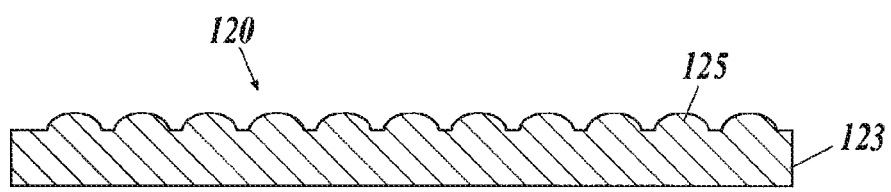
FIG. 11A is a schematic cross-sectional view showing an example of a light extraction film which forms an outcoupling film.
Figure 11B:
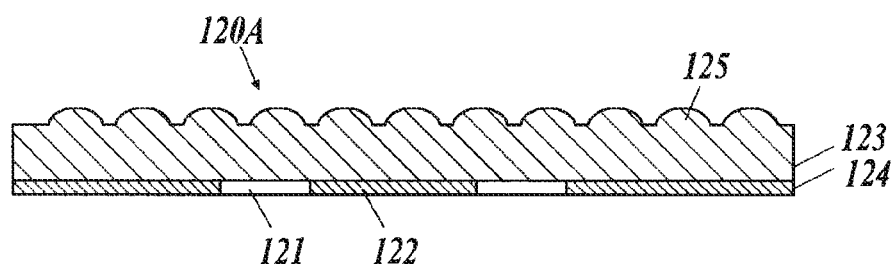
FIG. 11B is a schematic cross-sectional view showing an example of an outcoupling film including a light-transmitting part and a light-blocking part, which is suitable for use in the present invention.
Figure 11C:
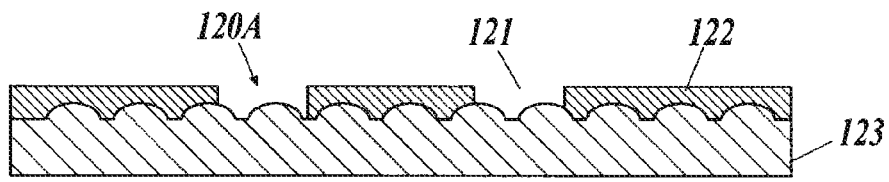
FIG. 11C is a schematic cross-sectional view showing another example of an outcoupling film including a light-transmitting part and a light-blocking part, which is suitable for use in the present invention.

FIGS. 11A to 11C are schematic cross-sectional views showing exemplary methods for forming an outcoupling film including a light-transmitting part and a light-blocking part, which is suitable for use in the present invention.

FIG. 11A shows the structure of a microlens film as an example of the light extraction film. The light extraction film (120) has a plurality of hemispherical microlenses (125) arranged on the light extraction-side surface of an optically transparent resin base material (123).

A pattern B including a transmitting part (121) and a light-blocking part (122) is formed, as follows, on the microlens film having such a structure. As shown in FIG. 11B, a print layer including a transmitting part (121) and a light-blocking part (122) is formed on the back side of the microlens film (125) as the light extraction film (120), for example, by screen printing, so that a pattern B-bearing light extraction film (120A) is obtained, which is suitable for use in the organic EL panel with the structure shown in FIG. 3.

Alternatively, as shown in FIG. 11C, a print layer including a transmitting part (121) and a light-blocking part (122) may be formed on the front side of the microlens film as the light extraction film (120), for example, by screen pinging, so that a pattern B-bearing light extraction film (120A) can be obtained and used.

The print layer may be formed using any ink composition specifically having a light-blocking effect and capable of forming a film with high scratch resistance. For example, a light-blocking ink composition containing a light-blocking pigment (such as a black pigment) and an ultraviolet-curable resin component may be used and applied to the light-blocking part (122) by screen printing and then cured by exposure to ultraviolet rays, so that the print layer can be formed.

The pint layer may be formed with any thickness sufficient to produce the desired light-blocking effect. The thickness of the print layer may be in the range of 0.1 to 100 μm, preferably in the range of 0.5 to 50 μm, more preferably in the range of 1 to 30 μm.

The screen printing used in the formation of the print layer is a common widely known printing method. The screen printing is a printing method that includes applying a light-blocking-part-forming ink composition onto the optically transparent resin base material (123) through a screen printing mask using an open squeegee and drying the ink composition to form the pattern B including the transmitting part (121) and the light-blocking part (122).

FIGS. 12A to 12D are schematic cross-sectional views showing other methods for forming an outcoupling film having a light-transmitting part and a light-blocking part, which is suitable for use in the present invention.

FIGS. 12A to 12D show methods for forming a pattern B including a transmitting part (121) and a light-blocking part (122) by using a light-scattering film (127) as the light extraction film (120).

Figure 12A:
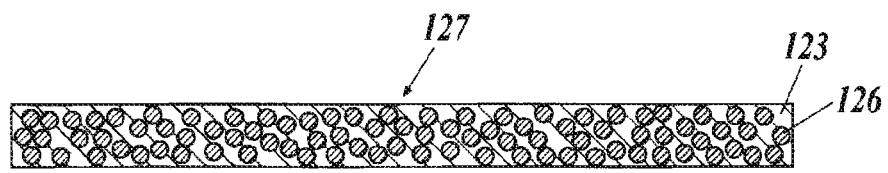
FIG. 12A is a schematic cross-sectional view showing an example of the structure of a light-scattering film suitable for use as a light extraction film which can form an outcoupling film.

FIG. 12A shows the structure of the light-scattering film (127) as an example of the light extraction film (120). The light-scattering film (127) includes an optically transparent resin base material (123) and light-scattering fine particles (126) therein. The light-scattering fine particles (126) may be inorganic fine particles (e.g., silica fine particles) or optically transparent resin fine particles.

Figure 12B:
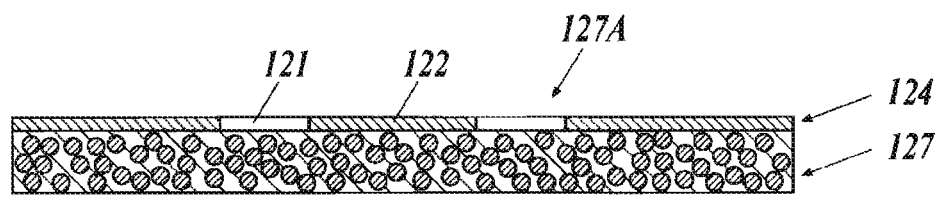
FIG. 12B is a schematic cross-sectional view showing an example where a light-scattering film is used to form an outcoupling film.

Referring to FIG. 12B, a print layer (124) including a transmitting part (121) and a light-blocking part (122) is formed on the upper surface (light extraction side) of the light-scattering film (127) by screen printing using a light-blocking-part-forming ink composition, so that a pattern B-bearing light extraction film (127A) is obtained, for example, which is suitable for use as the pattern B-bearing light extraction film (120A) in the organic EL panel with the structure shown in FIG. 2.

Figure 12C:
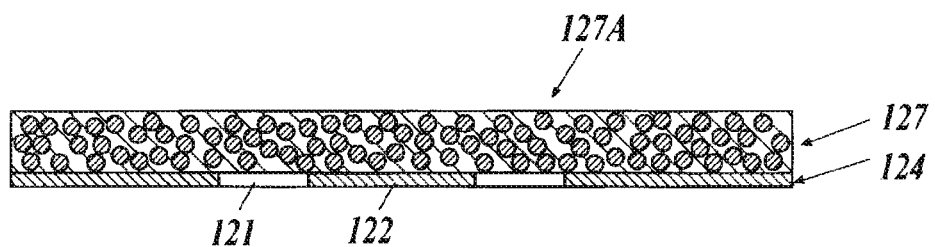
FIG. 12C is a schematic cross-sectional view showing another example where a light-scattering film is used to form an outcoupling film.

Referring to FIG. 12C, a print layer (124) including a transmitting part (121) and a light-blocking part (122) is formed in the same way on the lower surface (the surface adjacent to the organic EL device) of the light-scattering film (127) by screen printing using a light-blocking-part-forming ink composition, so that a pattern B-bearing light extraction film (127A) is obtained, which is suitable for use as the pattern B-bearing light extraction film (120A) in the organic EL panel with the structure shown in FIG. 3.

Figure 12D:
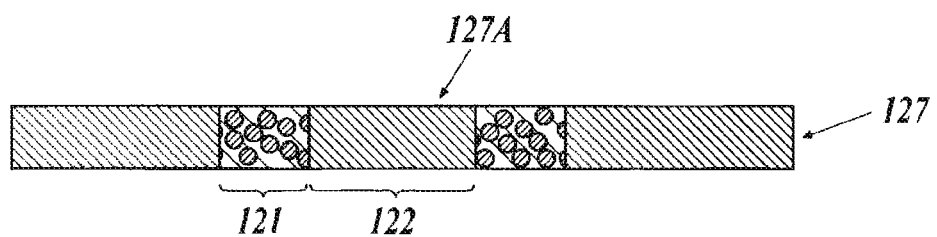
FIG. 12D is a schematic cross-sectional view showing another example where a light-scattering film is used to form an outcoupling film.

FIG. 12D shows an example where the light-scattering film (127) is impregnated with a light-blocking-part-forming ink composition by screen printing to form a light extraction film (127A) having a pattern B including a transmitting part (121) and a light-blocking part (122), which is suitable for use as the pattern B-bearing light extraction film (120A) in the organic EL panel with the structure shown in FIG. 4.

[Top Cover]

In the present invention, as shown in FIG. 5, the pattern B-bearing auxiliary member may be a pattern B-bearing top cover (110A), which includes a top cover (110) and a pattern B formed thereon and including a transmitting part (111) and a light-blocking part (112).

A top cover base material (113) may be used to form the top cover (110) suitable for use in the organic EL panel of the present invention. The top cover base material (113) may be selected from a glass base material such as a base material of soda ash glass, crystal glass, quartz glass, polarizing glass, laminated glass, tempered cover glass, or sandwich glass, and a plastic base material such as a base material of polyimide resin (PI), polycarbonate resin, polyethylene terephthalate resin (PET), polyethylene naphthalate resin (PEN), or cycloolefin resin (COP).

The pattern B including the transmitting part (111) and the light-blocking part (112) may be formed on the upper or lower surface of the top cover base material (113) by a method similar to the method of forming the pattern B on the light extraction film. In such a method, a print layer (114) including a transmitting part (111) and a light-blocking part (112) is formed on the upper or lower surface of the top cover base material (113) by screen printing using a light-blocking-part-forming ink composition, so that a pattern B-bearing top cover (110A) is obtained, which is suitable for use in the organic EL panel (106) with the structure shown in FIGS. 5 to 7.

<<Whole Structure of Information Device>>

Next, a description will be given of the structure of an information device including the organic EL module having the organic EL panel of the present invention.

Figure 13:
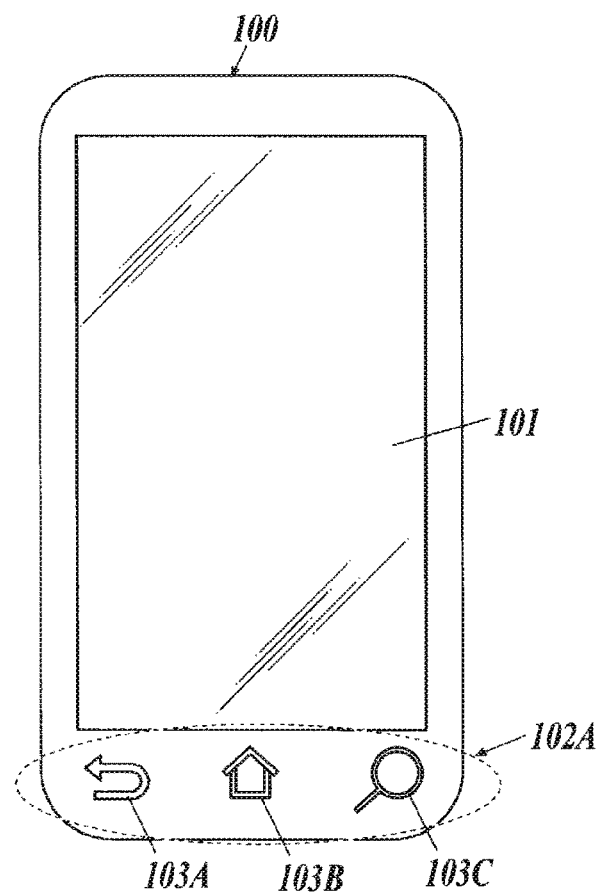
FIG. 13 is a schematic diagram showing an example of the whole structure (front surface side) of an information device according to the present invention, which has a sub display screen located on the display surface side.

FIG. 13 is a schematic diagram showing an example of the whole structure (front side) of the information device of the present invention including a main display screen (101) and a sub display screen (102A), in which the sub display screen (102A) is located on the same surface side as the main display screen (101).

The information device (100) shown in FIG. 13 includes a main display screen (101) including a liquid crystal display device and other components; a sub display screen (102A) provided on the front side and including the organic EL module having the organic EL panel of the present invention; and other components. A conventionally known liquid crystal display device may be used to form the main display screen (101).

The sub display screen (102A) includes a plurality of organic EL panels according to the present invention, in which icon display parts (103A to 103C) having different display patterns are arranged. As illustrated in FIG. 13, when the organic EL panels each emit light for each icon display, each display pattern of emitted light is observed. When the organic EL panels are in the non-light-emitting state, each display pattern is not observed. It will be understood that the display patterns on the icon display parts shown in FIG. 13 are mere non-limiting examples and may be replaced with any other figures, letters, or patterns.

Figure 14:
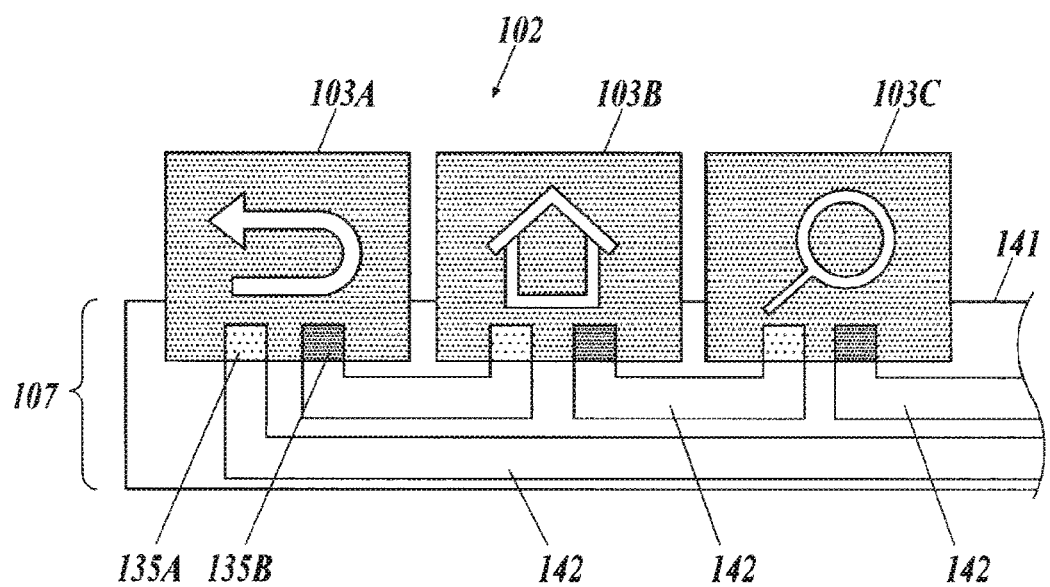
FIG. 14 is a schematic diagram showing an example of the structure of a group of organic EL modules for a sub display screen.

FIG. 14 is a schematic diagram showing an example of the configuration of a group of organic EL modules constituting the front-side sub display screen (102) shown in FIG. 13.

Referring to FIG. 14, in icon display parts (103A to 103C) having different display patterns and each including the organic EL module, the extraction electrodes (135A and 135B) are each connected to the wiring circuit (142) of the flexible printed circuit (FPC, 107) so that electric power is supplied to the organic EL panel of each icon display part through the wiring circuit (142). Reference sign 141 denotes a flexible board including polyimide or the like.

Figure 15:
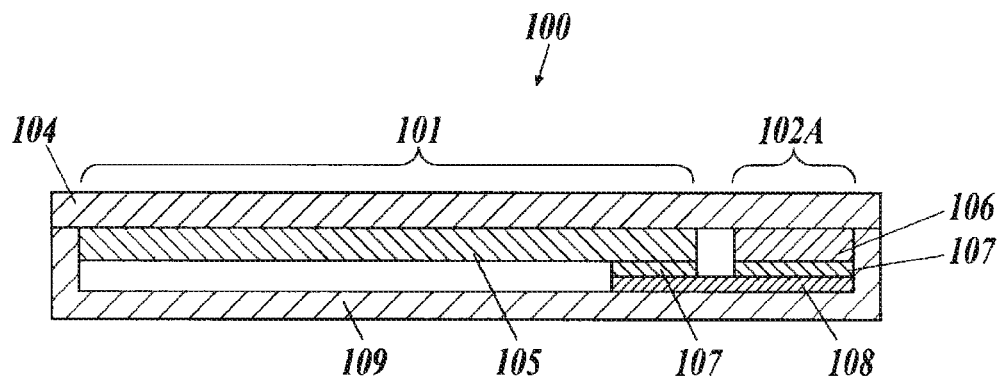
FIG. 15 is a schematic cross-sectional view showing an example of the structure of an information device according to the present invention, which has a sub display screen located on the display surface side.

FIG. 15 is a schematic cross-sectional view showing the information device (100) including the main display screen (101) and the sub display screen (102A) both provided on the front side as illustrated in FIG. 13.

As shown in FIG. 15, the information device (100) includes a cover glass (104) placed on the front side; the main display screen (101) having a liquid crystal panel (105) placed on the lower side; and other components such as a battery (not shown) as a driving power source and an information device control unit (not shown), which are housed under the liquid crystal panel (105). On the other hand, the organic EL panel (106) having the display patterns A and B according to the present invention is placed at the lower part of the sub display screen (102A), and the organic EL panel (106) is connected to a drive-controlling printed circuit board (108) through a flexible printed circuit (107) as an electrical connection unit.

The liquid crystal panel (105) is also connected to the printed circuit board (108) through the flexible printed circuit (107). The extraction electrode parts of the organic EL panel (106) may be electrically connected to the flexible printed circuit (107) using a conductive adhesive. The conductive adhesive is preferably an anisotropic conductive film (ACF), a conductive paste, or a metal paste although it may include any conductive component.

The anisotropic conductive film (ACF) may be, for example, a layer including a thermosetting resin and conductive fine particles mixed therein. The conductive particles-containing layer for use in the present invention may be appropriately selected from any layers containing conductive particles as an anisotropic conductive material, depending on the purpose. In the present invention, the conductive particles for use as the anisotropic conductive material are typically, but not limited to, metal particles or metal-coated resin particles, which may be appropriately selected depending on the purpose. Commercially available ACFs include low temperature-curable ACFs, such as MF-331 (manufactured by Hitachi Chemical Company, Ltd.), which are also suitable for use on resin films.

The metal paste may be appropriately selected and used from commercially available metal nanoparticle pastes such as silver particle pastes, silver-palladium particle pastes, gold particle paste, and copper particle pastes. Examples of metal pastes include silver pastes for organic EL element substrates (such as CA-6178, CA-6178B, CA-2500E, CA-2503-4, CA-2503N, and CA-271, specific resistance 15 to 30 mΩ·cm, formed by screen printing, curing temperature 120 to 200° C.), pastes for LTCC (PA-88 (Ag), TCR-880 (Ag), and PA-Pt (Ag.Pt)), and silver pastes for glass substrates (US-201 and UA-302, baking temperature 430 to 480° C.), which are commercially available from DAIKEN CHEMICAL CO., LTD.

A metal or plastic case (109) is placed around the circumference of the main display screen (101) and the sub display screen (102A).

In the information device of the present invention having a main display screen and a sub display screen, the sub display screen may be placed on the side opposite to the main display screen, in which the sub display screen is an icon display part and includes the organic EL module of the present invention.

Figure 16:
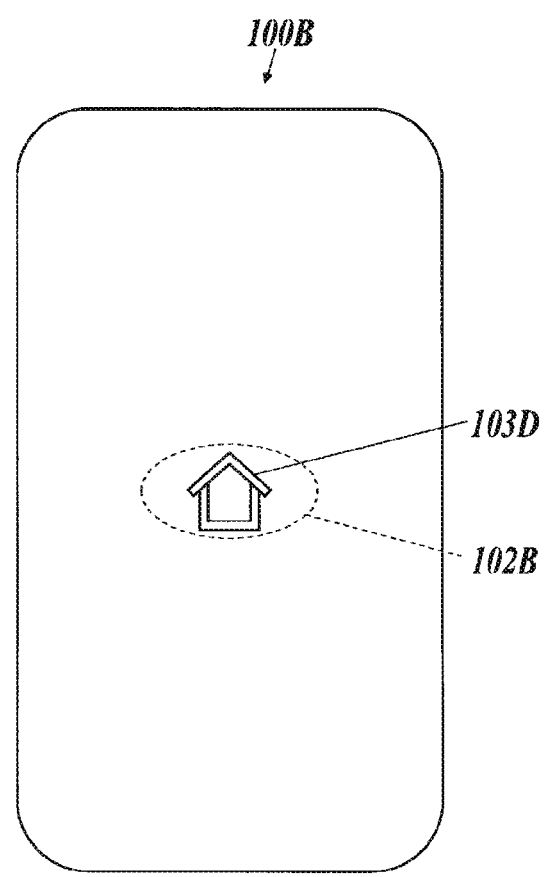
FIG. 16 is a schematic diagram showing an example of the whole structure (back surface side) of an information device according to the present invention, which has a sub display screen located on the back surface side.

FIG. 16 is a schematic diagram showing an example of the whole structure (back side) of an information device according to the present invention, which has a sub display screen located on the back side.

FIG. 16 shows an example of the information device in which the organic EL module (115) having the organic EL panel of the present invention is placed as a sub display screen part (102B) on the back side (100B) of the information device.

Figure 17:
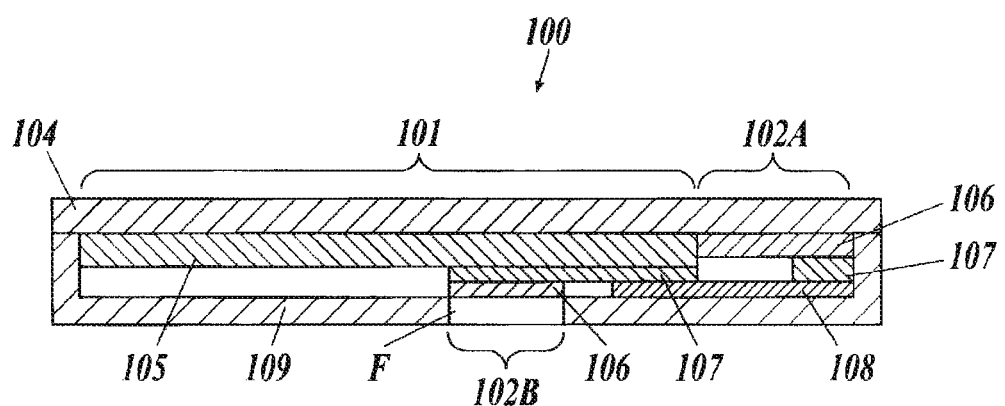
FIG. 17 is a schematic cross-sectional view showing an example of the structure of an information device according to the present invention, which has a sub display screen located on the back surface side.

FIG. 17 is a schematic cross-sectional view showing an example of the structure of the information device of the present invention, which has a sub display screen (102B) not only on the front side but also on the back side.

The information device (100) shown in FIG. 17 includes a main display screen (101) with the same cross-sectional structure as that shown in FIG. 15 and a front-side sub display screen (102A) with the same cross-sectional structure as that shown in FIG. 15. The information device (100) shown in FIG. 17 also includes another sub display screen (102B) on the back side, which includes an optically transparent protective member (F) and an organic EL panel (106) thereon. The flexible printed circuit (107) is so arranged as to be connected to the organic EL panel (106) and the printed wiring circuit PCB (108).

INDUSTRIAL APPLICABILITY

The organic EL panel of the present invention has a display pattern (such as an icon or logo pattern) that allows low power consumption, high emission uniformity, and high emission luminance ratio and makes it possible to reduce the manufacturing process time and to provide high productivity. The organic EL panel of the present invention is suitable for use in a variety of information devices such as smart phones and tablets.

REFERENCE SIGNS LIST

1 First electrode
1a Underlying layer
1b Electrode layer
3 Organic functional layer unit
3a Hole injection layer
3b Hole transport layer
3c Light-emitting layer
3d Electron transport layer
3e Electron injection layer
5a Second electrode
10 Organic EL element
13 Resin substrate
13a Light extraction surface
15 Auxiliary electrode
16 Extraction electrode
17 Sealant
19 Adhesive
h Emitted light
100 Information device
100A Front side of information device
100B Back side of information device
101 Main display screen
102 Sub display screen
102A Sub display screen on front side
102B Sub display screen on back side
103A, 103B, 103C, 103D Icon display part
104 Cover glass
105 Liquid crystal panel
106 Organic EL panel
107 Flexible printed circuit (FPC)
108 Printed circuit board (PCB)
109 Case
110 Top cover (auxiliary member)
110A Pattern B-bearing top cover (auxiliary member)
111 Light-transmitting part of top cover
112 Light-blocking part of top cover
113 Top cover base material
114 Print layer of top cover
115 Organic EL module
120 Light extraction film (auxiliary member)
120A Pattern B-bearing light extraction film (auxiliary member)
121 Light-transmitting part of light extraction film
122 Light-blocking part of light extraction film
123 Optically transparent resin base material (light extraction film base material)
124 Print layer of light extraction film
125 Microlens
126 Light-scattering fine particle
127 Light-scattering film 127A Pattern B-bearing light-scattering film
130 Pattern A-bearing organic EL device
131 Organic EL element
132 Light-emitting part of organic EL element
133 Non-light-emitting part of organic EL element
134 Transparent base material
135, 135A, 135B Extraction electrode part
141 Flexible substrate
142 Wiring circuit part
143 Detection circuit part
F Transparent protective member

The invention claimed is:

1. An organic electroluminescence panel comprising: an organic electroluminescence device comprising an organic electroluminescence element having a pattern A comprising at least a light-emitting part and a non-light-emitting part; and
at least one auxiliary member, wherein the organic electroluminescence element has a ratio of the emission luminance of the light-emitting part to the emission luminance of the non-light-emitting part of 5:1 to 50:1, and
the at least one auxiliary member has a pattern B being geometrically similar to the pattern A and comprising a light-transmitting part and a light-blocking part.

2. The organic electroluminescence panel according to claim 1, wherein a light extraction film and a top cover are stacked as the auxiliary members in this order on the organic electroluminescence device, wherein the light extraction film is an outcoupling film, and the pattern B is formed on the outcoupling film.

3. The organic electroluminescence panel according to claim 1, wherein a light extraction film and a top cover are stacked as the auxiliary members in this order on the organic electroluminescence device, and the pattern B is formed on the top cover.

4. The organic electroluminescence panel according to claim 1, wherein a top cover with the pattern B printed thereon is provided as the auxiliary member on the organic electroluminescence device.

5. The organic electroluminescence panel according to claim 1, wherein the light-emitting part of the pattern A of the organic electroluminescence element has an area larger than that of the light-transmitting part of the pattern B of the auxiliary member.

6. The organic electroluminescence panel according to claim 1, wherein a stack of the organic electroluminescence device and the auxiliary member forms a display part and a non-display part, and the ratio of the emission luminance of the display part to the emission luminance of the non-display part is higher than the ratio of the emission luminance of the light-emitting part to the emission luminance of the non-light-emitting part in the organic electroluminescence element of the organic electroluminescence device.

7. An organic electroluminescence module comprising: the organic electroluminescence panel according to claim 1; and an electrical connection unit placed on the panel.

8. An information device comprising a main display screen and a sub display screen, wherein the main display screen and the sub display screen are arranged on a same surface side, and the sub display screen is an icon display part and comprises the organic electroluminescence module according to claim 7.

9. An information device comprising a main display screen and a sub display screen, wherein the sub display screen is placed on a surface side opposite to the main display screen, and the sub display screen is an icon display part and comprises the organic electroluminescence module according to claim 7.

10. The organic electroluminescence panel according to claim 2, wherein the light-emitting part of the pattern A of the organic electroluminescence element has an area larger than that of the light-transmitting part of the pattern B of the auxiliary member.

11. The organic electroluminescence panel according to claim 2, wherein a stack of the organic electroluminescence device and the auxiliary member forms a display part and a non-display part, and the ratio of the emission luminance of the display part to the emission luminance of the non-display part is higher than the ratio of the emission luminance of the light-emitting part to the emission luminance of the non-light-emitting part in the organic electroluminescence element of the organic electroluminescence device.

12. An organic electroluminescence module comprising: the organic electroluminescence panel according to claim 2; and an electrical connection unit placed on the panel.

13. The organic electroluminescence panel according to claim 3, wherein the light-emitting part of the pattern A of the organic electroluminescence element has an area larger than that of the light-transmitting part of the pattern B of the auxiliary member.

14. The organic electroluminescence panel according to claim 3, wherein a stack of the organic electroluminescence device and the auxiliary member forms a display part and a non-display part, and the ratio of the emission luminance of the display part to the emission luminance of the non-display part is higher than the ratio of the emission luminance of the light-emitting part to the emission luminance of the non-light-emitting part in the organic electroluminescence element of the organic electroluminescence device.

15. An organic electroluminescence module comprising: the organic electroluminescence panel according to claim 3; and an electrical connection unit placed on the panel.

16. The organic electroluminescence panel according to claim 4, wherein the light-emitting part of the pattern A of the organic electroluminescence element has an area larger than that of the light-transmitting part of the pattern B of the auxiliary member.

17. The organic electroluminescence panel according to claim 4, wherein a stack of the organic electroluminescence device and the auxiliary member forms a display part and a non-display part, and the ratio of the emission luminance of the display part to the emission luminance of the non-display part is higher than the ratio of the emission luminance of the light-emitting part to the emission luminance of the non-light-emitting part in the organic electroluminescence element of the organic electroluminescence device.

18. A method for manufacturing an organic electroluminescence panel comprising: an organic electroluminescence device comprising an organic electroluminescence element having a pattern A comprising a light-emitting part and a non-light-emitting part; and at least one auxiliary member, the method comprising:
forming the light-emitting part and the non-light-emitting part by subjecting to the organic electroluminescence element to patterning by photoirradiation in such a manner that the ratio of the emission luminance of the light-emitting part to the emission luminance of the non-light-emitting part falls within the range of 5:1 to 50:1; and
forming a pattern B in or on the at least one auxiliary member in such a manner that the pattern B has a shape geometrically similar to the pattern A and comprises a light-transmitting part and a light-blocking part.

19. The method for manufacturing an organic electroluminescence panel according to claim 18, wherein the pattern A of the organic electroluminescence element is formed by batch patterning through a mask using ultraviolet light.

20. The method for manufacturing an organic electroluminescence panel according to claim 18, wherein the pattern B of the auxiliary member is formed by a printing method.

* * * * *